(12) United States Patent
Hsieh et al.

(10) Patent No.: US 7,119,394 B2
(45) Date of Patent: Oct. 10, 2006

(54) NONVOLATILE MEMORY DEVICE AND METHOD FOR FABRICATING THE SAME

(75) Inventors: Tsung-Min Hsieh, Miaoli (TW);
Jhyy-Cheng Liou, Jhubei (TW);
Chien-Hsing Lee, Jhubei (TW);
Chin-Hsi Lin, Hsinchu (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 11/297,266

(22) Filed: Dec. 7, 2005

(65) Prior Publication Data

US 2006/0086967 A1    Apr. 27, 2006

Related U.S. Application Data

(62) Division of application No. 10/987,045, filed on Nov. 12, 2004, now Pat. No. 7,020,018.

(60) Provisional application No. 60/564,819, filed on Apr. 22, 2004, provisional application No. 60/587,894, filed on Jul. 13, 2004.

(51) Int. Cl.
*H01L 29/788* (2006.01)

(52) U.S. Cl. .................... 257/316; 257/317; 257/321; 257/324

(58) Field of Classification Search ........ 257/314–317, 257/319–322, 324
See application file for complete search history.

(56) References Cited

U.S. PATENT DOCUMENTS 6,987,298 B1 *   1/2006   Lee et al. .................. 257/324

* cited by examiner

*Primary Examiner*—Thien F. Tran
(74) *Attorney, Agent, or Firm*—J.C. Patents

(57) ABSTRACT

A structure of non-volatile memory has a plurality of buried bit lines in a substrate, extending along a first direction. Selection gate structure lines are located between the buried bit lines. A plurality of stack dielectric films on the both sides of the selection gate structure lines serving as a charge storage region, does not extend to the bit lines and a dielectric layer contacting a surface of substrate adjacent to stacked dielectric films. Word lines are over the substrate, wherein stacked dielectric films and a dielectric layer are interposed between WL and substrate on the region excluding the selection gate structure line, extending along a second direction different from the first direction. Since the charge storage layer does not completely cover between the selection gate structure lines and the bit lines, an additional control gate is formed.

7 Claims, 31 Drawing Sheets

Program                                Program operation

TPW                                    TPW(GND)

Read operation                         Reverse Read operation

TPW                                    TPW(GND)

Erase operation                        Erase operation

TPW(GND)                               TPW(GND)

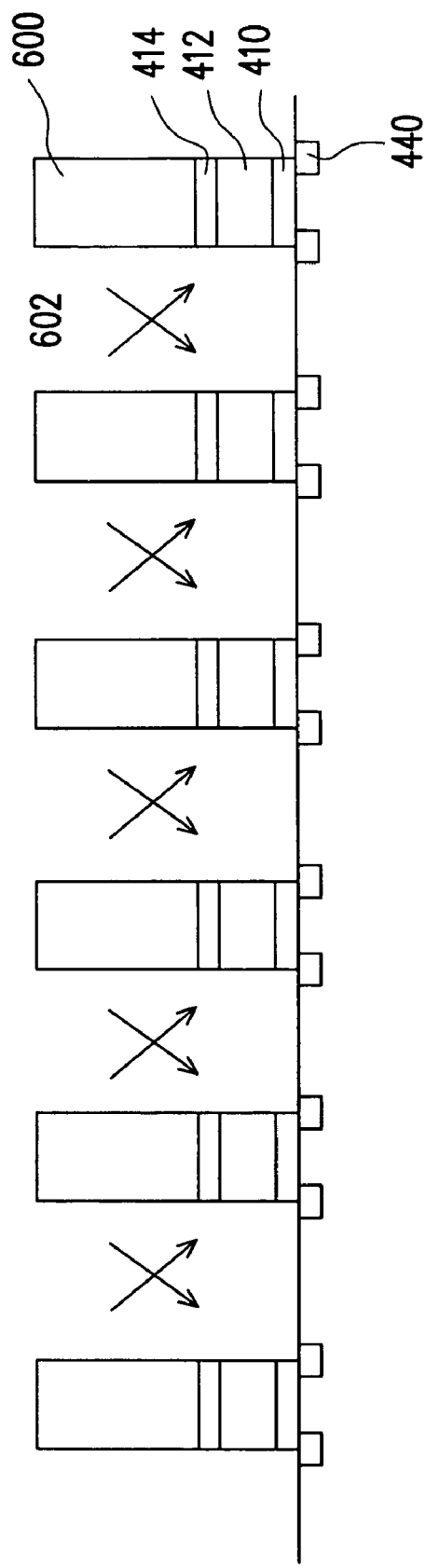
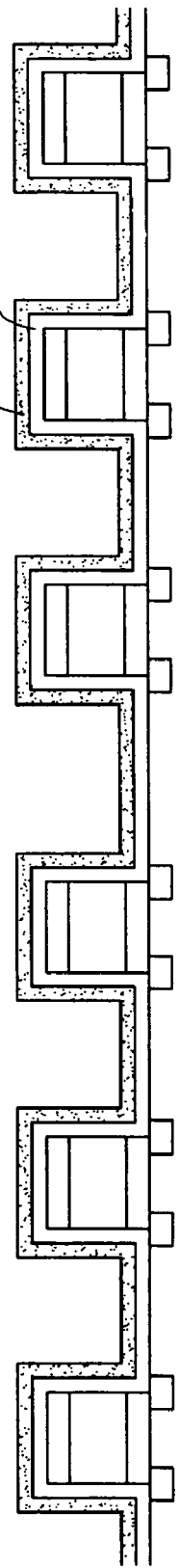
FIG. 16A
FIG. 16B

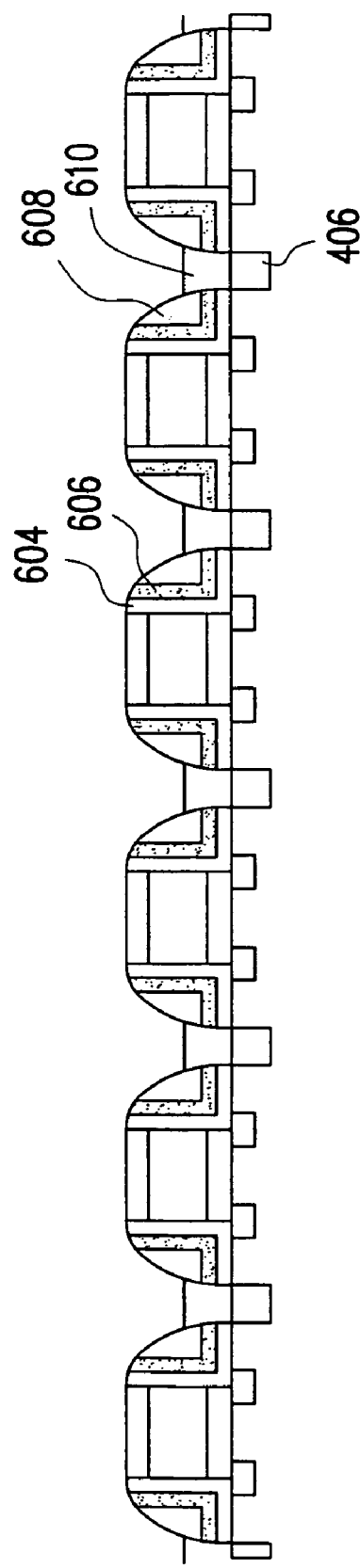
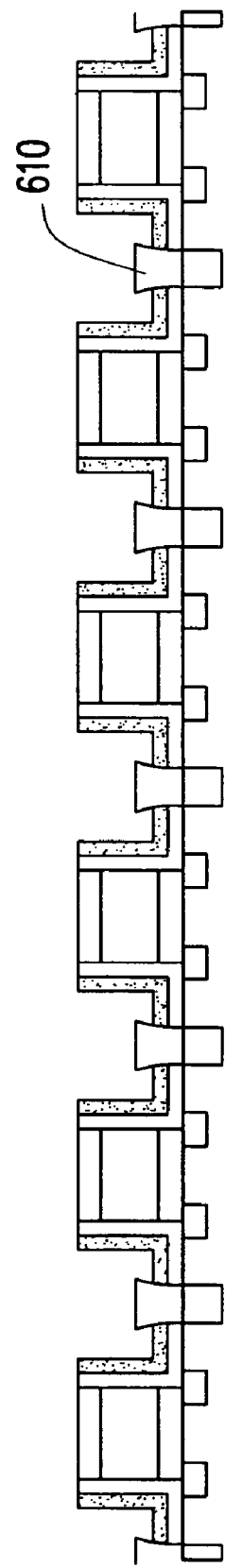
FIG. 16C
FIG. 16D

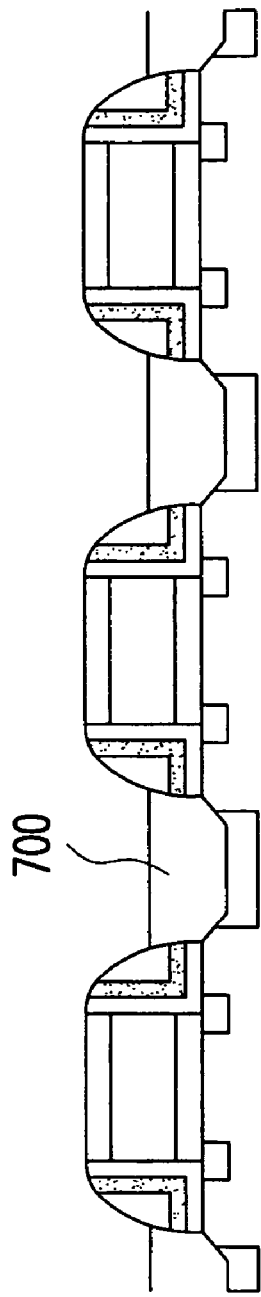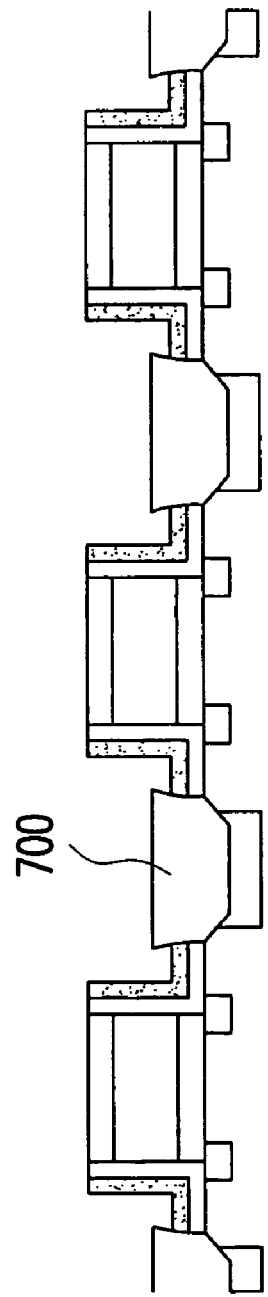
FIG. 17E
FIG. 17F

NONVOLATILE MEMORY DEVICE AND METHOD FOR FABRICATING THE SAME

CROSS-REFERENCE TO RELATED APPLICATION

This application is a divisional application of, and claims the priority benefit of, U.S. application Ser. No. 10/987,045 filed on Nov. 12, 2004, now U.S. Pat. No. 7, 020,018 which claims the priority benefits of U.S. provisional applications, both titled "METHOD TO FORM A NOVEL NON-VOLATILE MEMORY DEVICE", filed on Apr. 22, 2004, Ser. No. 60/564,819 and on Jul. 13, 2004, Ser. No. 60/587,894 respectively. All disclosures of these applications are incorporated herein by reference.

BACKGROUND OF THE INVENTION

1. Field of Invention

The present invention relates to semiconductor memory device. More particularly, the present invention relates to nonvolatile memory device with selection gate and fabrication method.

2. Description of Related Art

Flash memory device allows multiple-time erase and program operation inside system. As a result, flash memory is suitable to many of advance hand-held digital apparatuses, such as solid state disks, cellar phones, digital cameras, digital movie cameras, digital voice recorders, and personal digital assistant (PDA), that are demanding a low-cost, high-density, low-power-consumption, highly reliable file memory.

Basically, data flash memory has two typical cell structures. One is double poly NAND type memory cell with poly1 as floating gate to store charges; and the other one is single poly SONOS cell with SiN as storage node. A conventional NAND flash includes numerous strings of series connected N-channel transistor. Device operation of NAND flash utilizes channel Fowler-Nordheim (FN) mechanism for programming and erasing, and cell size for the NAND type flash memory cell is around 4–5$F^2$, here F represents a critical dimension used in semiconductor fabrication as a dimension reference for describing cell size.

On the other hand, conventional SONOS technology is a NOR type flash memory with buried N+ structure. FIG. 1 is a cross-sectional view, schematically illustrating a conventional SONOS flash memory. Device operation of SONOS cell is adopted channel hot carriers for programming and B-B hot holes for erase. FIG. 2 is top view, schematically illustrating the layout of the memory cell with respect to FIG. 1. In FIG. 1 and FIG. 2, the N-well 102 and the P-well 104 are formed in the substrate 100, such as a P-type substrate. Since the whole flash memory includes memory region and the logic region, the various wells are formed to have the CMOS device. The memory cells are formed in the T(triple)P-well 104 as can be understood by the ordinary skilled artisans. For this kind of flash memory, the bit lines BL0, BL1, . . . , BLm 106 are formed in the substrate with strip doped regions. This kind of design for the bit lines is also called the buried bit line design. FIG. 2 only shows the layout for the bit lines 106 and the word lines 110. The charge storage is achieved by the oxide 108a/nitride 108b/oxide 108c (O/N/O) structure layer 108. The word line 110 also serves as the necessary gate.

The operation mechanisms for above cell design in programming, reading and erasing operations are shown in FIG. 3. The word line (WL) is also the gate electrode. The adjacent two bit lines serve as the source/drain (S/D) region in the substrate. The oxide/nitride/oxide (O/N/O) structured layer is between the gate electrode and the substrate, in which the nitride layer is used to store the charges. Due to the charges in the nitride layer almost not moving, the injected charges can be localized in the nitride layer. Therefore, according to the voltages applied on the bit lines, for example for the programming operation at the top two drawings. For the operation shown in left drawing, due to the hot electrons, desired charges are stored in the nitride layer, in which the charges are localized at the one side. However, for the reversed direction shown the right drawing, the charges are stored in the nitride at the left side. Then, for the reading operation, according to the reading direction, the two sides can be separated read. The stored charges change the threshold voltage, so that the stored binary data can be sensed. The erasing operation is to inject the band-to-band (B—B) holes to the nitride layer to neutralize the electrons, so as to erase. Basically, The programming operation is to change the threshold voltage from low to high, and the erasing operation is to change the threshold voltage from high back to low. The operation should be well known by the skilled artisans and the detailed description is skipped.

However, the conventional SONOS flash memory has the disadvantages. As shown in FIG. 3, charges in nitride layer may laterally diffuse between twin bits in SONOS cell. Although the charge trapped in nitride or other discrete comparing to charges in conductor film, the charges still drift at high temperature for a long period, indicating charge loss. When storage charges drift occurs, the charge can move to the location where the erased hot holes can not reach and result in un-erased bit or the bit can not be ignored during reverse read, i.e. so called second bit effect. Further, due to the unlimited storage region caused by the nitride on the whole channel, the program and erase region can not overlap properly and also results in un-erased bit or second bit effect. In addition, the conventional hot carriers with low injection efficiency for programming consumes a larger current that can't support page mode programming.

To improve the above disadvantages, another conventional structure of memory device, a charge storage O/N/O structure arranged between the buried bit line and a selection gate is proposed. The selection gate is located between the bit lines to provide the limited storage region, so the second bit effect described above can be removed FIGS. 4A–4B are cross-sectional views, schematically illustrating another conventional structure of memory device. In FIG. 4A, for example, by applying the programming voltage on the bit line BL and the selection gate SG to create a source side hot electron injection with low current and high efficiency, the hot electrons can be driven into the nitride layer. Likewise, when the memory cell is intended to be erased, an erasing voltage is applied to drive holes into the nitride layer to neutralize the electron charges.

However, in this conventional structure as uniquely investigated by the invention, the erase operation cannot efficiently remove the trapped electrons in the nitride layer of the O/N/O structure. The mechanism is described in better detail as follows. Since the nitride layer is the dielectric and is not a conductive material, the trapped hot electrons during programming operation basically are localized near to the selection gate without mobility due to the source side hot electron injection. In other words, the electrons have the distribution as shown in FIG. 4C. However, when the erase operation is performed, the holes h+ have the tendency to be localized at the region near the junction of bit line BL, as shown in FIG. 4D. Due to low mobility for the carriers in the nitride layer, the electrons and the holes are not fully neutralized with respect to the position. This situation still exits even though the amounts of electrons and the holes are equal. Then, it would cause the read error due to the residual charges.

In another consideration, if the electrons are to be completely removed, then the amount of hole should increase to cover over the electron distribution. However, in this situation, after the erase operation, the residual positive holes stay in the nitride layer. It would cause the error for the next programming operation. In other words, the conventional structure in FIG. 4A has the issue in read error and programming error. If the density of the subsequent charges is increased each time to cover over the previous charges, then the residual charges are accumulated each operation. It then causes a failure of the memory cell. Also and, the operation voltages are not stable for each time of operations.

In another words, due to the different direction of charge transport for program and erase, it is hard to obtain the same electron or hole distribution in discrete storage layer (FIGS. 4C–4D), indicating low program and erase (Program/Erase) cycling window. This phenomenon can be explained as following: For erased cell, a lot of holes will trap on the storage layer near BL junction. When the erased cell is programmed again, however, electrons are difficult to inject to the storage layer over BL junction because the high electrical field distributes on the interface of select transistor and memory transistor. Therefore, in order to obtain reasonable program threshold voltage, it needs to inject more electrons than that needed in first program to compensate the effect of holes accumulating on unwanted location. After several P/E cycling, it may cause a peak of holes piling up on the storage layer near the BL junction. The unwanted holes may make the threshold voltage of programmed memory reduction, or cell not to be programmed again. Another impact of the pile-up of holes is to cause the potential failure of data retention. The reasons are described as follows. Although the storage layer like nitride is not conductive, the charges is still able to migrate in the nitride and the mobility of hole is higher than that of electrons. For a period of high temperature baking that is frequent used in reliability testing, the holes will migrate laterally. Especially, due to electrons and holes piled up on both ends of storage layer, the electrical field is created between them. The electrical field will accelerate the migration speed of holes. The migration of holes will decrease the threshold voltage of program or erase cell, indicating the poor retention performance. The case will be worse with the increase of P/E times.

On the other hand, such a memory is not allowed to over erase according to its array structure. To overcome this over-erase issue, the complicated erase verification is necessary. Besides, once the cell is over erased, the BL to BL leak will be serious to make the error bit. All of above discussed issues are at least to be solved, in order to improve the performance of programmable memory device. Particularly, the issues occurred in FIGS. 4C–4D, as investigated by the invention, are necessary to be solved.

SUMMARY OF THE INVENTION

The invention provides a non-volatile memory device, which can have efficient erase operation without causing much residue charges in the charge storage layer.

The invention provides a non-volatile memory device, which has selection gate design with capability to effectively prevent the bit error from occurring. Therefore, the charges can be well localized at the desired location. Also and, the selection gate can create a low program current and high program efficiency.

The invention provides an array structure of non-volatile memory has a plurality of bit lines in a substrate, extending along a first direction. Selection gate structure lines are located between the bit lines, wherein a dielectric contacting a surface of a semiconductor substrate and gate electrode contacting to a dielectric form a selection transistor, wherein the gate electrode is connected to the selection gate structure line. A plurality of stacked dielectric films contacting a surface of substrate are on both sides of the selection gate structure lines, wherein each of a plurality of stacked dielectric films serves as a charge storage region and does not extend to the bit lines, and a dielectric layer contacting a surface of substrate adjacent to a plurality of stacked dielectric films. Word lines are over the substrate and contacting the stacked dielectric film and a dielectric, extending along a second direction different from the first direction, so that the word lines cross the selection gate structure lines and the bit lines to form a two-dimension array of dual-bit memory cells. Wherein a memory transistor is formed by that a plurality of stacked dielectric films contact a surface of a semiconductor substrate and a gate electrode contact a plurality of stacked dielectric films and the gate electrode is connected to WL; wherein a control transistor is formed by that a dielectric contacts a surface of a semiconductor substrate, a gate electrode contacts a dielectric and a gate electrode is connected to WL. Since charge storage layer does not completely cover between the sidewall of the selection gate structure lines and the bit lines, an additional control gate is formed.

The invention further provides another structure of non-volatile memory has a plurality of bit lines in a substrate extending along a first direction. A plurality of selection gate structure lines are located between the bit lines, wherein a selection transistor is formed by that a dielectric contacts a surface of a semiconductor substrate, gate electrode contacts to a dielectric form a selection transistor and a gate electrode is connected to the selection gate structure line. A plurality of stacked dielectric films contacting a surface of substrate are on each side of the selection gate structure lines and a dielectric contacting a surface of a substrate is interposing between selection line and a plurality of stacked dielectric films, wherein each of a plurality of stacked dielectric films serves as a charge storage region. A plurality of word lines are over the substrate, extending along a second direction different from the first direction, so that the word lines cross the selection gate structure lines and the bit lines to form a two-dimension array of dual-bit memory cells. Wherein a memory transistor is formed by that a plurality of stacked dielectric films contact a surface of a semiconductor substrate and a gate electrode contact a plurality of stacked dielectric films and the gate electrode is connected to WL; wherein a control transistor is formed by that a dielectric contacts a surface of a semiconductor substrate, a gate electrode contacts a dielectric and a gate electrode is connected to WL.

In the foregoing structure, a set of operation voltages, with respect to a program operation, a read operation, or an erase operation is applied to the buried bit lines, the selection gate structure lines, and the word lines, to operate the non-volatile memory.

The invention provides a structure of non-volatile memory has a substrate. Bit lines are formed in the substrate along a first direction, wherein each of the bit lines also serve as a source/drain (S/D) region. A first dielectric layer is disposed over the substrate. Selection gate (SG) lines are formed over the first dielectric layer between the bit lines. L-shape charge-storage structure layers are formed over sidewalls of the SG lines the substrate between the bit lines and the SG lines. Pocket doped regions are formed in the substrate about under bending corners of the L-shape charge-storage structure layers, wherein the pocket doped regions have different conductive-type to the bit lines. A second dielectric layer is formed over the SG lines. A third dielectric layer is formed over the bit lines. Word lines are formed over the substrate along a direction, crossing the bit lines.

According to another aspect of the invention, the invention also includes an HVT (high voltage threshold) transistor between the word lines.

Therefore, the invention further includes a tilt implantation using the selection gate lines as a mask, wherein a photoresist mask layer may be or may not on top of the selection gate.

According to another aspect of the invention, the invention can further include a plurality of high threshold voltage (HVT) transistors between adjacent two word lines, using the SG line as a gate electrode and adjacent two bit lines as two S/D regions of the HVT transistors.

According to another aspect of the invention, a structure of a non-volatile memory unit with two-bit memory capacity comprises a substrate. Two doped lines are located in the substrate. A selection gate structure line is disposed on the substrate between the two doped lines. A charged storage structure layer, located each side of the selection gate structure line between the doped lines and the selection gate line. A plurality of pocket doped regions are formed in the substrate about under sidewalls of the selection gate structure line. A first dielectric layer is disposed over the selection gate structure line. A second dielectric layer and disposed over the doped lines. A gate electrode layer is disposed crossing over the doped lines and the selection gate structure line.

According to another aspect of the invention, the invention provides the fabrication method to fabricate the non-volatile memory device.

The present invention provides a method for fabricating a non-volatile memory device on a substrate, comprising forming a plurality of selection gate lines over the substrate. Wherein, each of the selection gate lines comprises a gate dielectric layer on the substrate and a gate layer on the gate dielectric layer. A tilt implantation process is performed to form a pocket doped region in the substrate about under sidewalls of the selection gate lines. A tunneling dielectric layer and a charge storage layer are sequentially formed over the substrate, wherein the sidewalls of the selection gate lines are also covered by the tunneling dielectric layer and the charge storage layer. A dielectric layer is formed over the substrate. An etching back process is performed on the dielectric layer to form spacers over sidewalls of the selection gate lines. Wherein, a portion of the tunneling dielectric layer and the charge storage layer is also removed to expose the selection gate lines and the substrate. An implantation process is performed to form buried bit lines in the substrate, using the selection gate lines and the spacers as an implantation mask. An etching mask layer is formed on the exposed portion of the substrate between the spacers, wherein the spacers remains being exposed. An etching process is performed to remove the spacers, using the etching mask layer as a mask. A top dielectric layer is deposited over the substrate. Wherein, the top dielectric layer with the charge storage layer and the tunneling dielectric layer form an L-shape charge storage structure layer on sidewalls of the selection gate lines and on the substrate between the pocket doped region and the buried bit lines. A conductive layer is deposited over the substrate. The conductive layer is patterned to form a plurality of word lines, which is crossing the buried bit lines, wherein memory cells are formed under the word lines.

According to another aspect, the foregoing method further comprises using the word lines as a mask, performing a threshold adjusting implantation over the substrate to form threshold-adjusting doped regions under the selection gate lines and between the word lines. As a result, the selection gate lines with adjacent buried bit lines form transistors between the word lines, having an increased threshold voltage with respect to a threshold voltage of the memory cells.

According to another aspect, the foregoing method further comprises etching the substrate to form a shallow trench, so that the bit lines are formed in the substrate under the trench.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 16A–16G are cross-sectional views, schematically illustrating the fabrication process of the nonvolatile memory device, according to an embodiment of the invention.

FIGS. 17A–17H are cross-sectional views, schematically illustrating the fabrication process of the nonvolatile memory device, according to another embodiment of the invention.

DESCRIPTION OF THE PREFERRED EMBODIMENTS

Embodiment 1

Figure 5A:
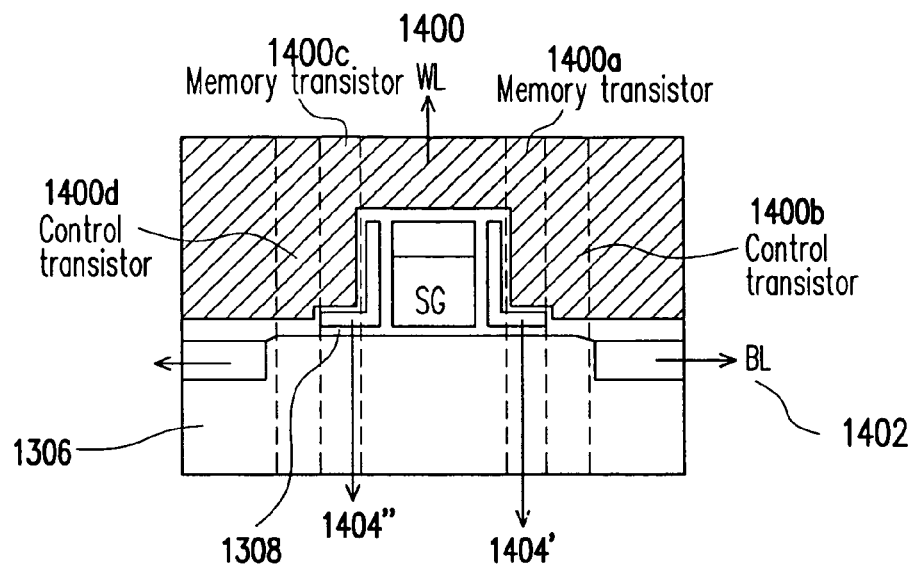
FIGS. 5A–5C are cross-sectional and top views and a simplified circuit, schematically illustrating a structure of non-volatile memory device, according to an embodiment of the invention.

In the invention, a novel structure of non-volatile memory is proposed. First referring to FIGS. 5A–5C, which are cross-sectional views and top views, and a simplified circuit, schematically illustrating a structure of non-volatile memory device, according to an embodiment of the invention. In FIG. 5A, the buried bit line BL 1402 is formed in the substrate 1306. A gate structure with the selection gate SG is disposed on the substrate 1306 between two bit lines 1402. The gate structure can include the gate insulating layer between the selection gate SG and the substrate 1306. A cap layer can, for example, further be included at top of the selection gate SG. The oxide layer 1308 of the O/N/O charge storage structure layer is formed at least at the sidewall of the gate structure and on the substrate between the selection gate and the bit line 1402. The L-shape charge storage layers 1404' and 1404", such as nitride layers, are formed ate the sidewall of the gate structure, another oxide layer is formed over the L-shape charge storage layers 1404' and 1404" and the gate structure. A oxide layer is formed on the surface between nitride and BL 1402. Then, a word line WL 140 is formed over the substrate 1306, covering the gate structure and the bit line. It should be noted that the dielectric insulating layer are not described in detail but it should understood by the ordinary skilled artisans about the necessary isolation.

In the structure of FIG. 5A, the horizon part of the L-shape charge storage layer 1404', 1404" is used to store the charges, and does not extend to the bit line BL 1402. In other words, the memory transistors 1400a, 1400c are formed at both side of the gate structure. However, the control transistors 1400b, 1400d are located between the memory transistors 1400a, 1400c and the bit lines 1402.

Figure 5B:
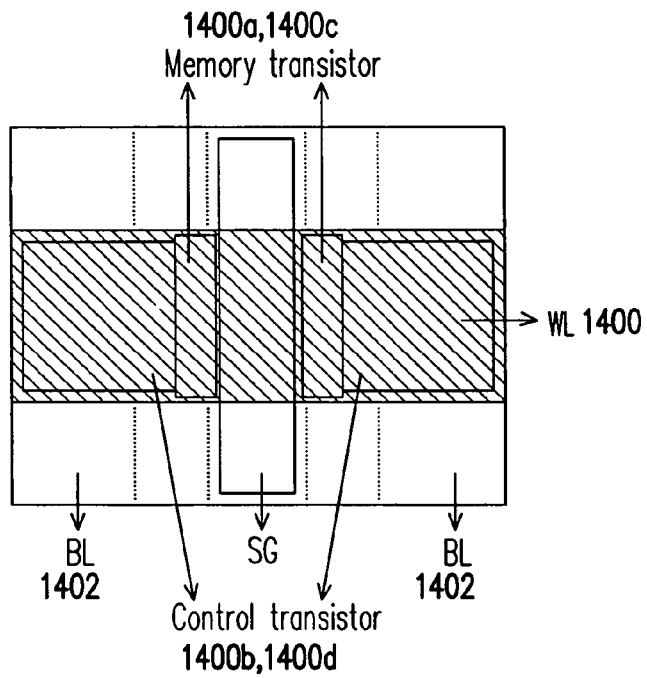
Figure 5C:
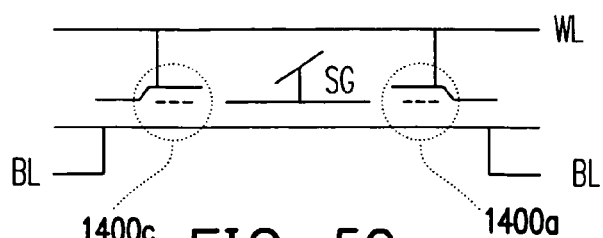

In FIG. 5B, from the top view, the structure of the memory cell can be divided in several region corresponding to the cross-section structure in FIG. 5A. The word line also serves the gate line. When the word line 1400 is applied a proper voltage, the bit line formed by the doped region can pass to the edge of the L-shape charge storage layer 1404', 1404". In FIG. 5C, the equivalent circuit is schematically shown, in which the dash line represents the charge storage region, such as the silicon nitride layer.

Figure 1:
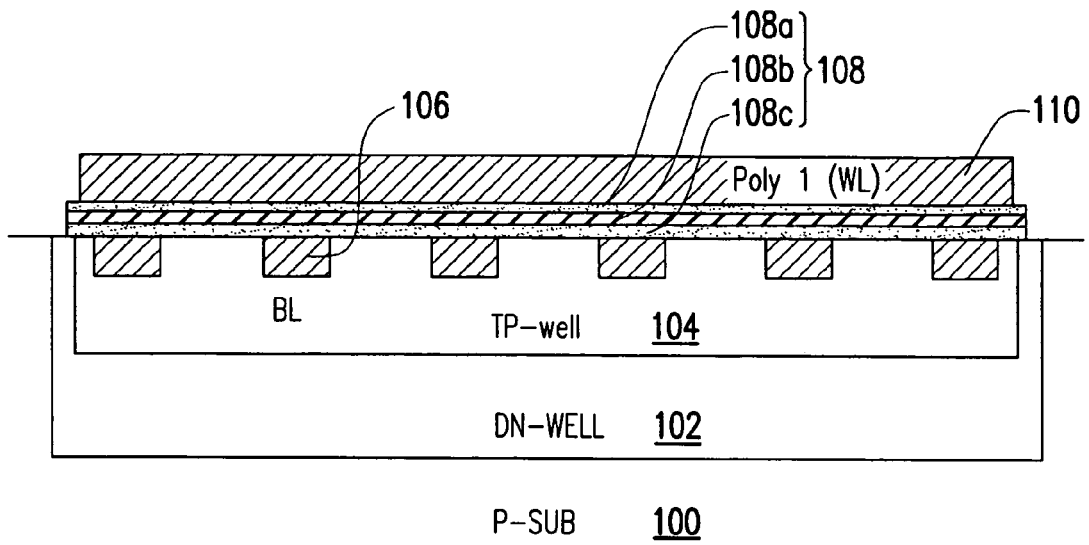
FIG. 1 is a cross-sectional view, schematically illustrating a conventional SONOS flash memory.
Figure 2:
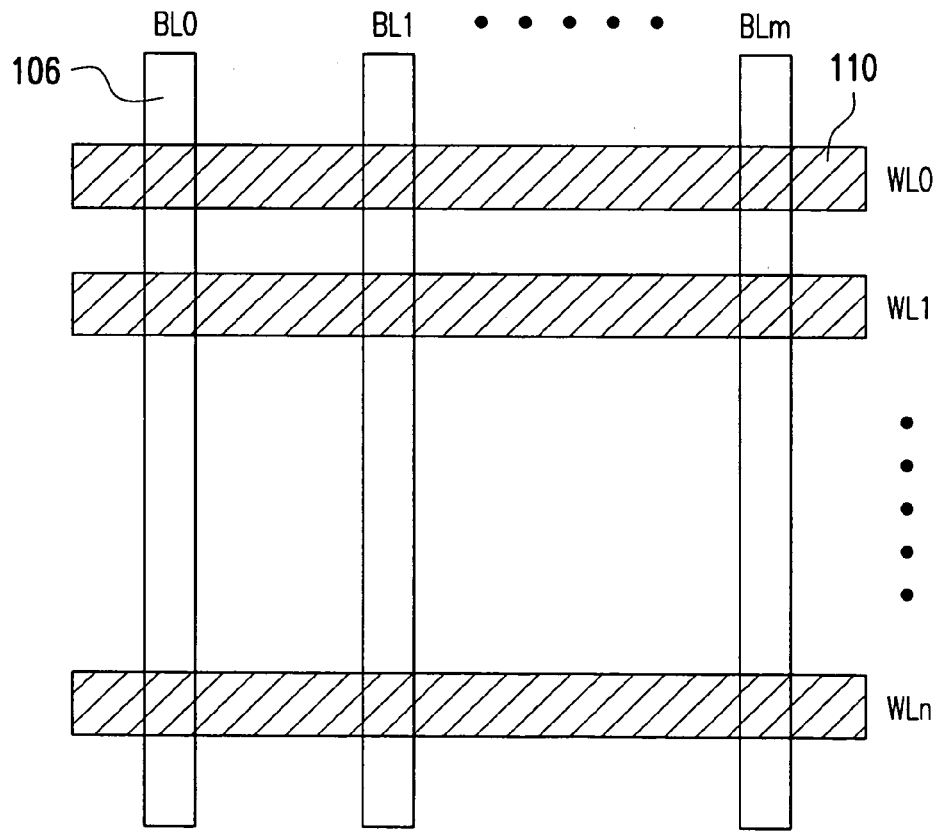
FIG. 2 is a top view, schematically illustrating the layout for the bit lines and word lines with respect to FIG. 1.
Figure 3:
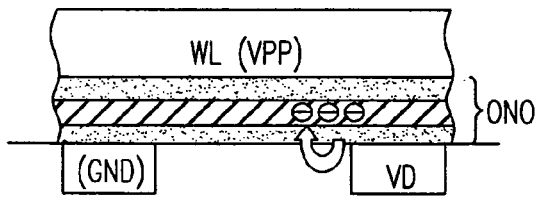
FIG. 3 is a drawing, schematically illustrating the operation mechanism for the conventional non-volatile memory in FIG. 1.
Figure 3:
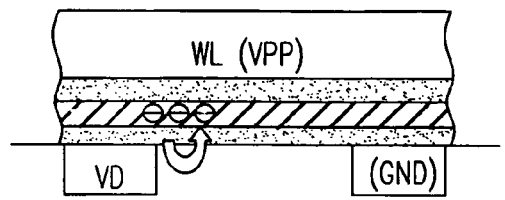
Figure 3:
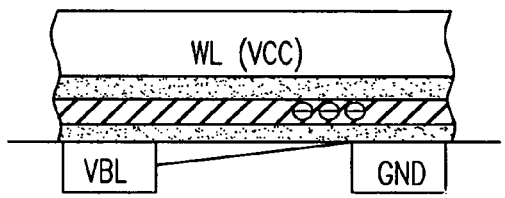
Figure 3:
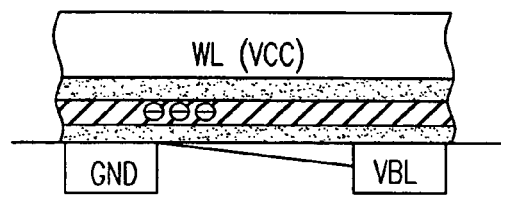
Figure 3:
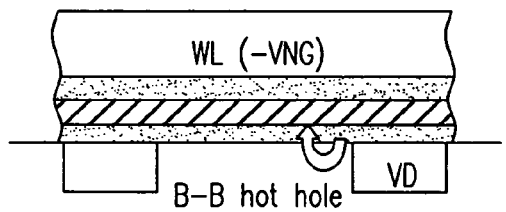
Figure 3:
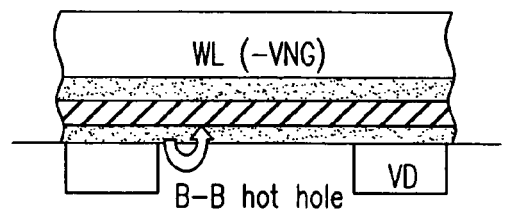
Figure 4A:
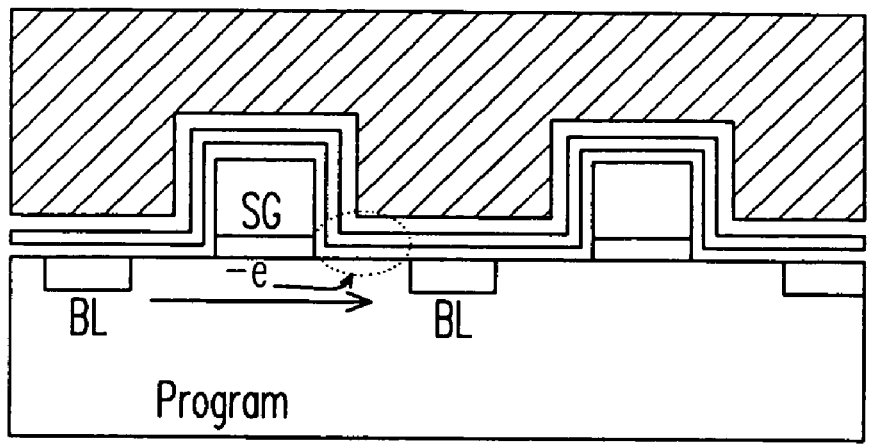
FIGS. 4A–4B are cross-sectional view, schematically illustrating the conventional structure of memory device.
Figure 4B:
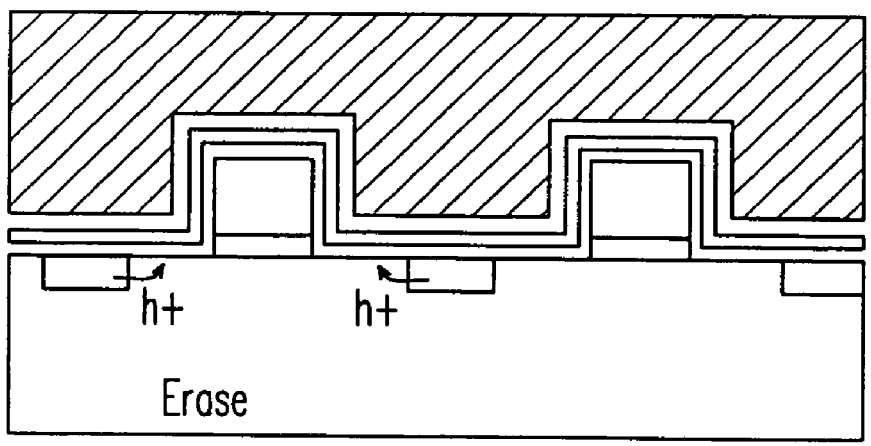
Figure 4C:
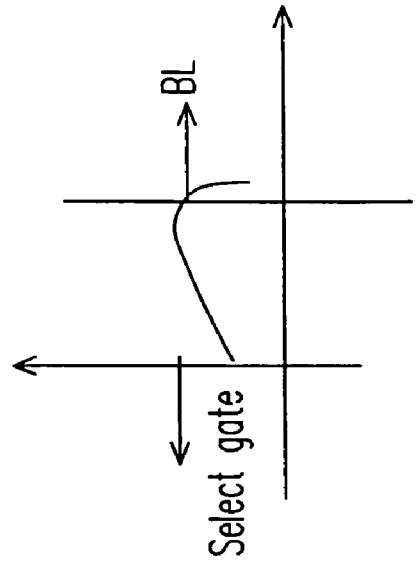
FIGS. 4C–4D are drawings, schematically the charge distribution in the nitride layer, with respect to the conventional structure of memory device in FIGS. 13A–13B.
Figure 4D:
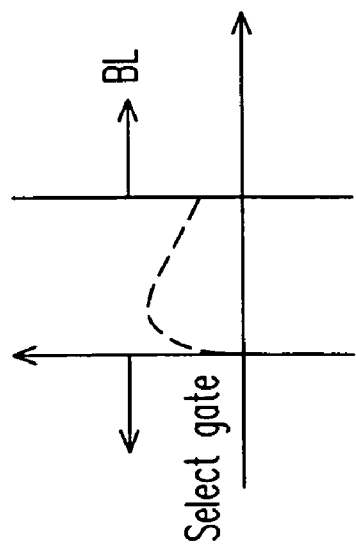
Figure 6A:
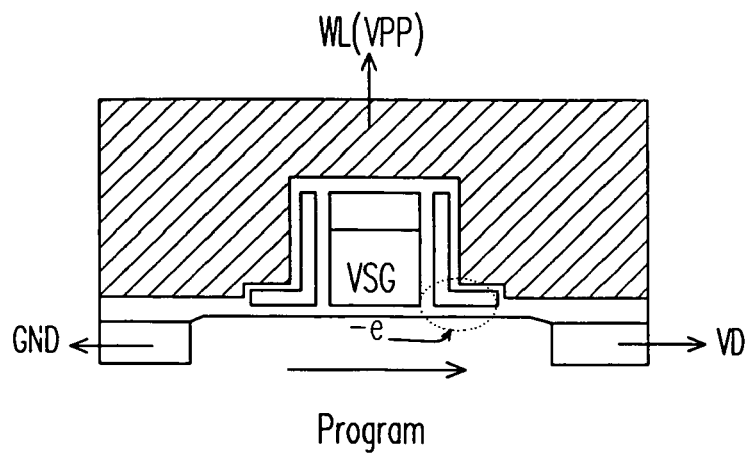
FIGS. 6A–6C are cross-sectional views, schematically illustrating the program, read, and erase operations for the structure in FIG. 5A.
Figure 6B:
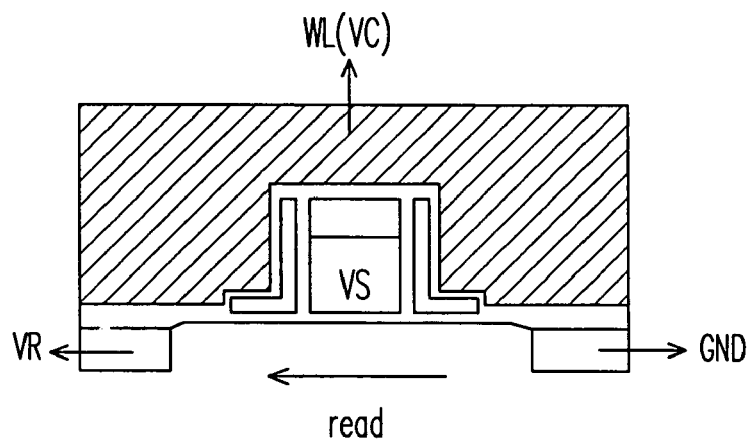
Figure 6C:
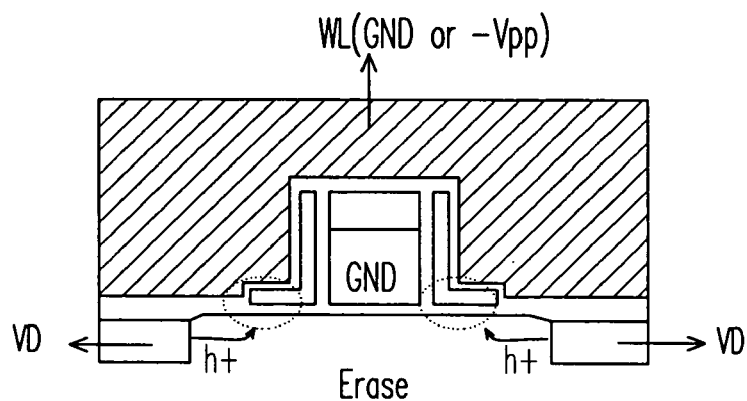

In this structure, due to the horizontal part of the L-shape charge storage layer 1404', 1404" is shorter and no storage layer over the BL junctions, the issues, for example, discussed in FIGS. 4C–4D can be effectively reduced. The electrons and the holes can be effectively neutralized and no holes piling up bear BL junctions. The mechanism for the program, read, and erase operations are shown in FIGS. 6A–6C. The electrons and the holes h+ are in better localization, so that the residual charges can be effectively reduced after erase operation. This also ensures the correction of the read program operations under a set of stable operation voltages. The more operation will be described later also.

Figure 7:
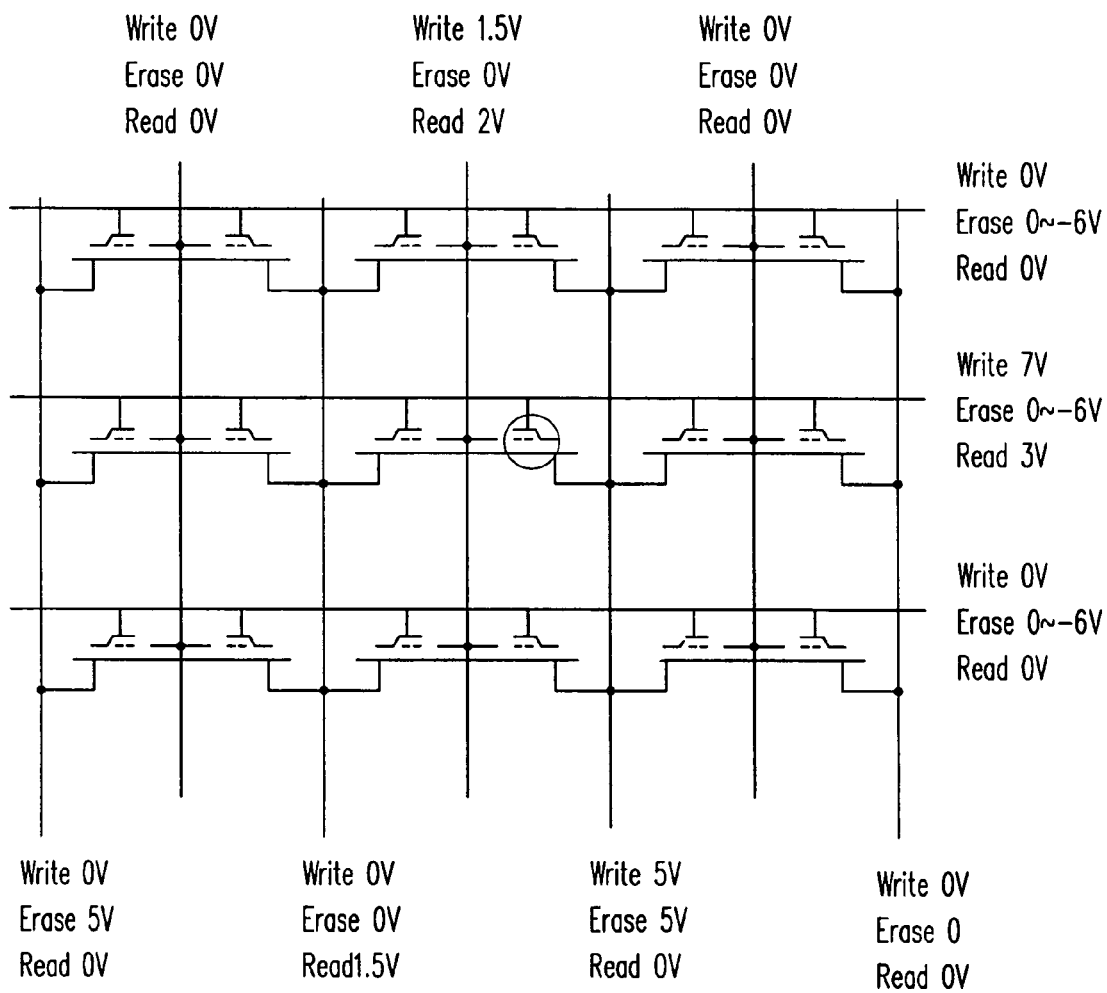
FIG. 7 is a circuit drawing, schematically illustrating the circuit structure of the memory device, according to the structure in FIG. 5A of the invention.

FIG. 7 is a circuit drawing, schematically illustrating the circuit structure of the memory device, according to the structure in FIG. 5A of the invention. In FIG. 7, the set of operation voltage as an example for write, read and erase are shown. The horizontal lines are word lines, coupled to the gate. The selection gate line is at the middle of the dual-bit memory cell. The bit line is coupled to the source/drain of the memory cell. For example, for the write (or program in other descriptions) operation, in order to drive the hot electrons into the horizon part of the L-shape nitride layer, the word line and bit line of the written cell are set in relative high positive voltages.

Figure 8A:
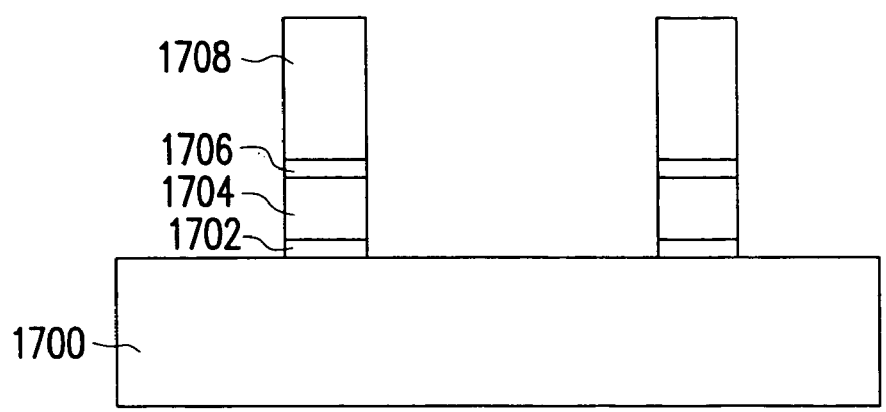
FIGS. 8A–8E are cross-sectional views, schematically illustrating a fabrication process for forming the structure in FIG. 5A of the invention.

FIGS. 8A–8E are cross-sectional views, schematically illustrating a fabrication process for forming the structure in FIG. 5A of the invention. In FIG. 8A, a gate structure including the gate insulating layer 1702, the selection gate layer 1704, a cap layer 1706 are sequentially formed on the substrate 1700. The selection gate layer can be, for example, the polysilicon layer. The gate insulating layer 1702 can be, for example, gate oxide layer, and the cap layer 1706 is the dielectric, such as silicon oxide or silicon nitride. Then, a patterned photoresist layer 1708 is formed on the cap layer 1706. An etching process is performed to expose the substrate 1700.

Figure 8B:
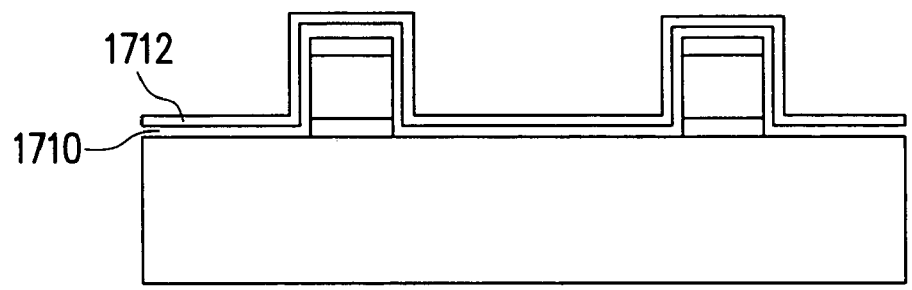
Figure 8C:
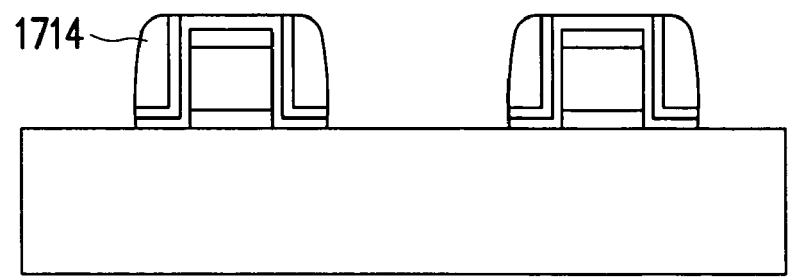

In FIG. 8B, a first dielectric layer 1710, such as silicon oxide layer, is deposited over the substrate 1700 to at least cover sidewalls of the selection gate structure line. A charge storage layer 1712, such as the silicon nitride layer, is deposited over the substrate 1700. In FIG. 8C, a spacer 1714 is formed at sidewall of the selection gate on the charge storage layer 1712. Then, using the spacer as a part of the mask, a self-aligned etching process is performed to etch the exposed portion of the first dielectric layer 1710 and the charge storage layer 1712, so that the substrate 1700 is exposed. Then, the L-shape charge storage layer 1712 is formed. Here, an O/N/O structure is taken as the example to have the charge storage structure.

Figure 8D:
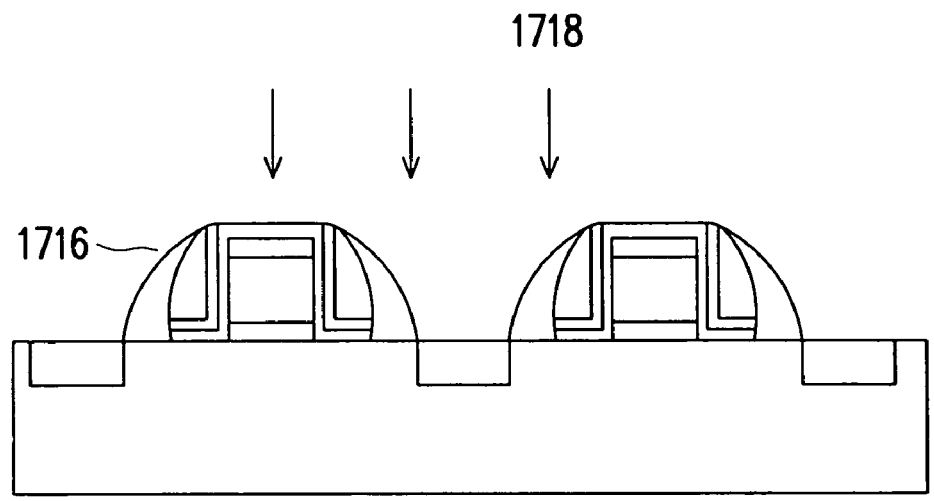

Another spacer 1716 is formed on the spacer 1714 in FIG. 8D. Due to the spacer 1726, the spacer 1716 is on the substrates 1700 but not on the charge storage layer 1712. Then, self-aligned implantation process 1718 is performed to form bit lines in the substrate, as the buried bit lines. In other words, the bit line and the selection gate lines are extending in the same direction.

Figure 8E:
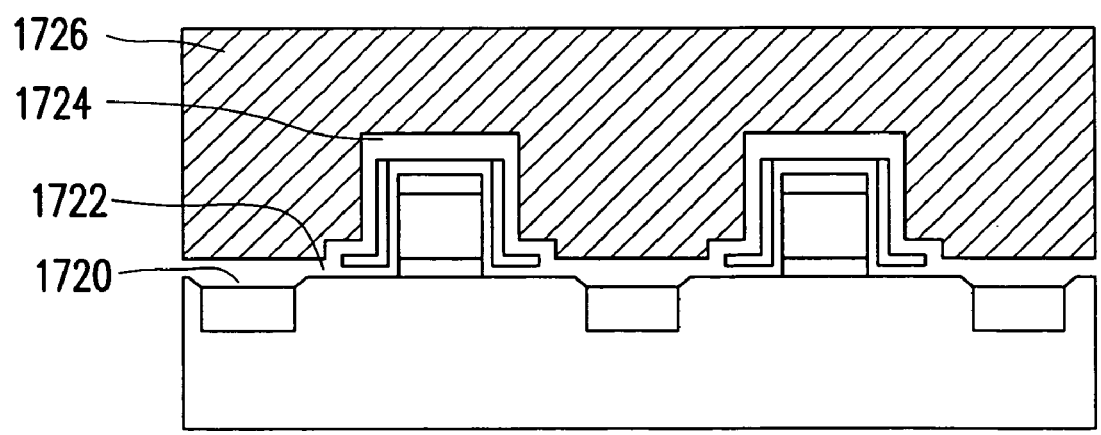

In FIG. 8E, the spacers 1714 and 1716 are removed by for example wet etching. As a result, the horizontal portion of the L-shape charge storage layer 1712 is not extending to the bit line. A second dielectric layer 1724, such as silicon oxide layer, is formed over the substrate to cover the selection gate structure and the buried bit line. Then, the word line 1726 is formed over the substrate, crossing over the bit lines and the selection gate structure line.

Figure 9A:
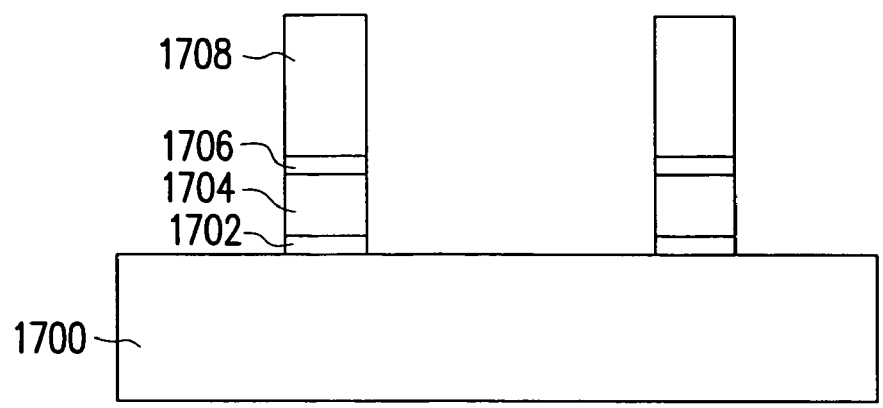
FIGS. 9A–9F are cross-sectional views, schematically illustrating another fabrication process for forming the structure in FIG. 5A of the invention.
Figure 9B:
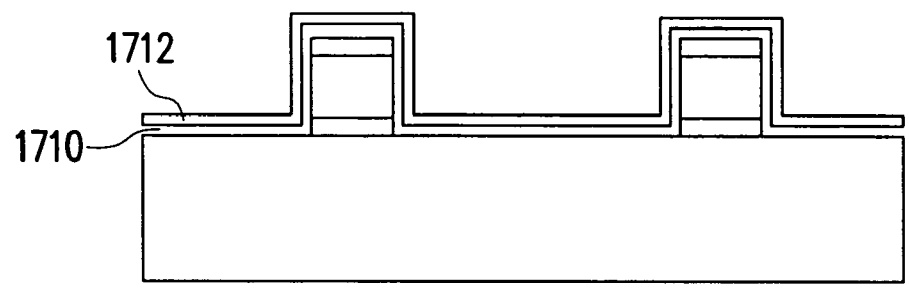
Figure 9C:
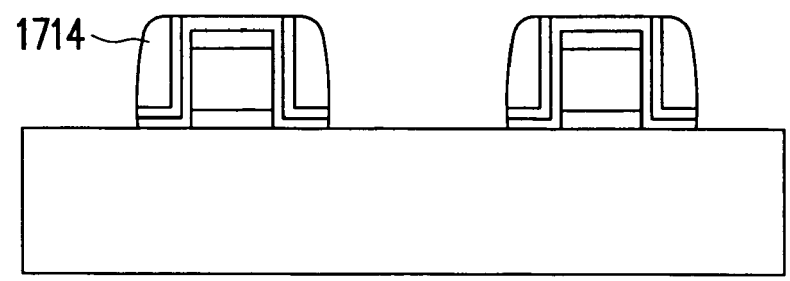
Figure 9D:
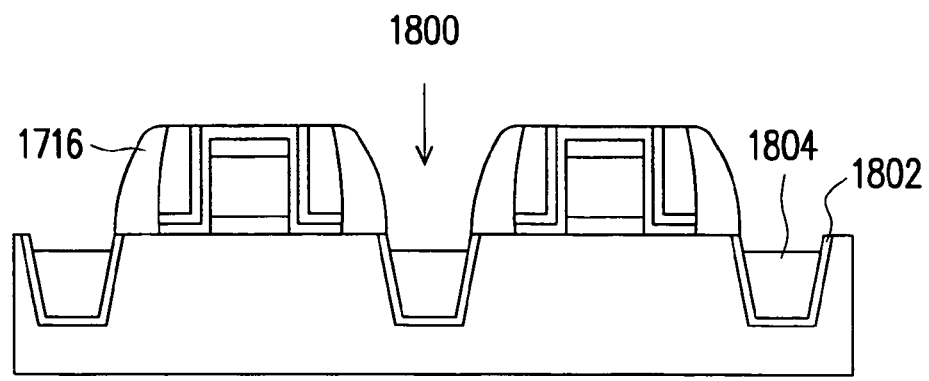

Alternatively, another fabrication procedure can form a similar structure, wherein the bit line is not the buried bit line but is a bit line formed in a trench of the substrate. FIGS. 9A–9F are cross-sectional views, schematically illustrating another fabrication process for forming the structure in FIG. 5A of the invention. The processes in FIGS. 9A–9C are similar to the processes in FIGS. 8A–8C, and are not described. In FIG. 9D, after the spacer 1716 is formed, a self-aligned etching process is performed to form trenches 1800 in the substrate. Then, a lining oxide layer 1802 can be formed on peripheral surface of the trench 1800. A photoresist material 1804, can be filled into the trench 1800.

Figure 9E:
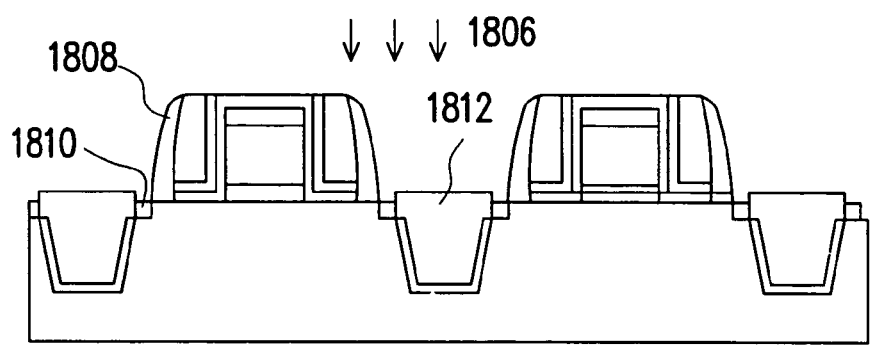
Figure 9F:
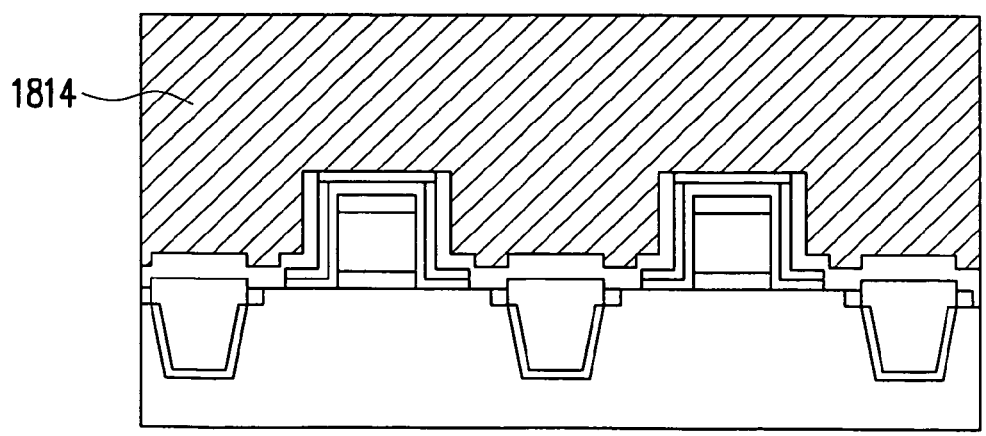

In FIG. 9E, a further etching process, such as wet etching, is performed to reduce the width of the spacer and further expose the substrate 1700. The photoresist material 1804 is removed to expose the trench. Then a polysilicon layer 1812 is filled into the trench, and an implantation process 1806 can be performed to dope the polysilicon layer 1812, so as to form the doped bit line 1812 in the substrate 1700. In FIG. 9F, the spacers are removed, and a top oxide layer is formed over the substrate and the word line 1814, such as polysilicon word line, is formed over the substrate.

Similar to FIG. 8E, the oxide layer and the word line are formed over the substrate. In this embodiment, the bit line is a bit line in the substrate with the trench. However, the feature is similar. The horizontal part of the L-shape charge storage layer is also not extending to the bit line.

The advantages of the foregoing memory cell at least includes substantially no charge laterally diffusion effect, substantially no over erase issue, and lower BL leakage current. Further, it can allow and offer lower programming current for page mode program operation. Select transistor will separate charge storage layers of two adjacent memory cells that prevents charge laterally diffusion indicating no second bit effect. The control transistor with single dielectric between memory transistor and BL (doped layer) can immunize the holes trapped on the unwanted location to avoid program and retention failure due to no storage layer near BL junction. Besides, because the effective thickness of single dielectric of control transistor can be smaller than the stacked dielectric layers for memory transistor, the band to band hot holes are easy to be created and not to be impacted due to few holes trapped on the dielectric over the BL junction, which means repeatable erase operation. Moreover, if the memory transistor is over erased, the control transistor can turn off the current of unselect cells with the same SG during reading, indicating that over erase is not an issue and circuit design is easier.

The memory cell comprises the oxide layer 1308 serving as the bottom tunnel oxide with thickness around, i.e.

20A–80A, storage SiN 1404', 1404" to store data charge with thickness range of, for example, 40A–100A and top block charge oxide with thickness of, for example, 50A–100A for memory transistor. The gate oxide for the control transistor is about 80A–150A. Here, the SiN layer of SONOS cell can be replaced to any dielectric layer that can capture or store electron and hole during program and erase operation, like Si rich SiN, tantalum oxide (Ta2O5), Aluminum oxide (Al2O3) and nano-crystal Silicon.

Figure 10A:
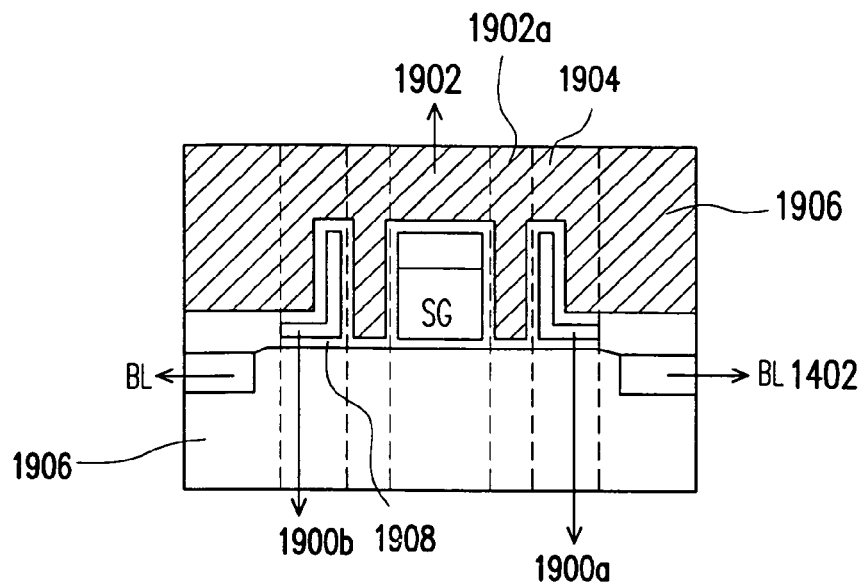
FIGS. 10A–10C are cross-sectional views and top views, and a simplified circuit, schematically illustrating a structure of non-volatile memory device, according to another embodiment of the invention.

With the similar consideration with respect to FIG. 5A, another structure is proposed in FIG. 10A. The structure of dual-bit memory cell in FIG. 10A is an NOR type array architecture. This memory cell includes: (a) a pair of impurity layers 1402 for BL acting as the source or drain; (b) one select transistor 1902, wherein a dielectric layer is interposed between gate electrode and semiconductor substrate, sandwiched between two control transistors; (c) two memory transistors, wherein a storage layer like ONO is interposed between gate electrode and semiconductor surface, adjacent to control transistor and BL; (d) two control transistors, wherein a dielectric layer is interposed between gate electrode and semiconductor surface, adjacent to select transistor and memory transistor; and (e) The gates of two memory transistors and two control transistors are electrically connected to WL, crossing BL and SG.

In comparing the structure in FIG. 10A with the structure in FIG. 5A, The L-shape charge storage structure, including the L-shape silicon nitride layer 1900a, 1900b, is separated from the sidewall of the selection gate structure (SG) by a distance. When the word line 1906 is formed over the substrate 1906, the region 1902a forms the control gate, and the region 1904 forms another control gate, so as to control the horizontal portion of the L-shape charge storage structure. The insulating dielectric as the isolation is disposed between the bit line and the word line. FIG. 10A is a schematic drawing, in which the key features include the arrangement of the L-shape charge storage layer 1900a, 1900b and the region 1902a. The other necessary isolation dielectric is not precisely described but should be known by the ordinary skilled artisans.

Figure 10B:
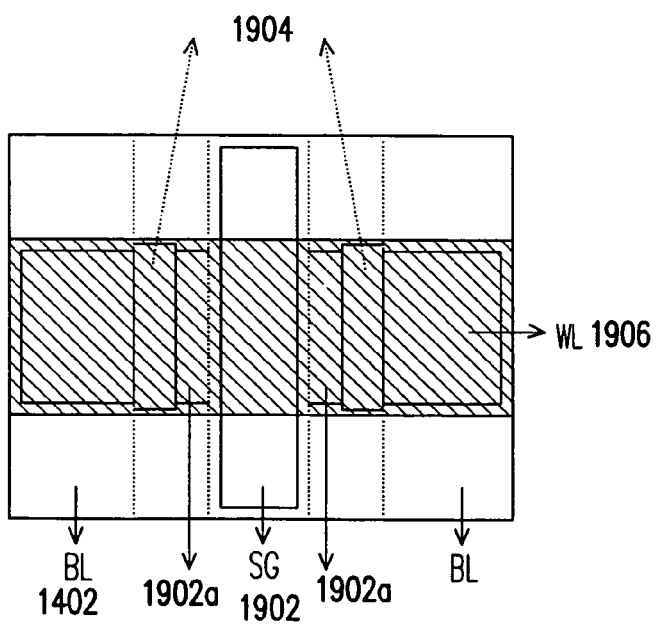
Figure 10C:
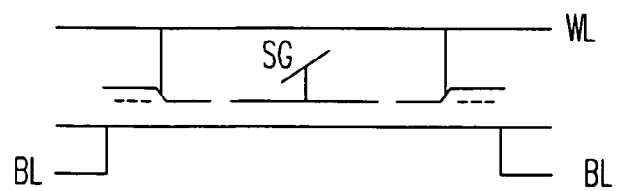

In FIG. 10B, the top view is schematically shown. The word line WL 1906 in one direction crossing the bit line BL. Several regions 1902, 1902a, 1904 are shown. In FIG. 10C, the equivalent circuit is shown also, in which the dash line represents the charge storage region, such as the silicon nitride layer.

The advantages of this cell at least includes, substantially no charge laterally diffusion effect to cause second bit effect, substantially no over erase issue, and lower BL leakage current. Select transistor will separate charge storage layers of two adjacent memory cells that will prevent charge laterally diffusion to cause adjacent data missing. The control transistor with single dielectric between select transistor and memory transistor can prevent the electron trap near the select transistor. And the drain junction hot electron injection is adopted, which has the same distribution of holes by band to band hot hole injection. Therefore, the program and erase cycling window can be improved. Moreover, if the memory transistor is over erased, the control transistor can turn off the current for unselect cells with the same SG during reading.

The novel memory cell, for example, comprise of the bottom tunnel oxide with thickness around 20–80A, storage SiN to store data charge with thickness range of about 40–100A and top block charge oxide with thickness of 50–100A for memory transistor. The gate oxide for the control transistor is about 80–150A. Here, SiN layer of SONOS cell can be replaced to any dielectric layer that can capture or store electron and hole during program and erase operation, like Si rich SiN, tantalum oxide (Ta2O5), Aluminum oxide (Al2O3) and nano-crystal Silicon.

Figure 11A:
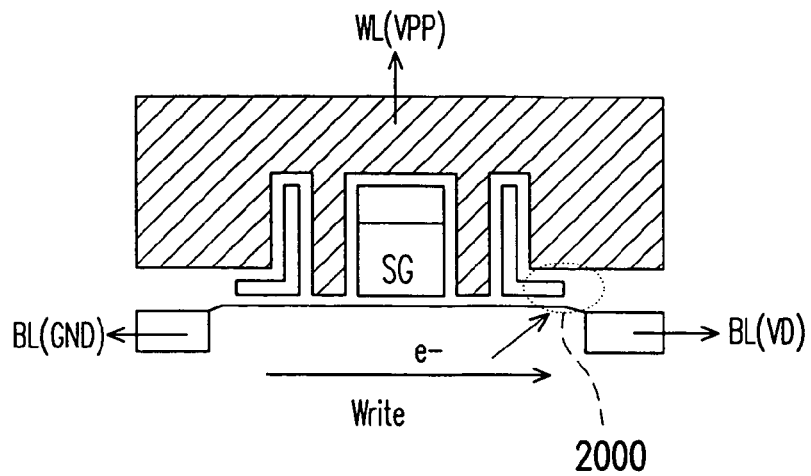
FIGS. 11A–11C are cross-sectional views, schematically illustrating the program, read, and erase operations for the structure in FIG. 10A.
Figure 11B:
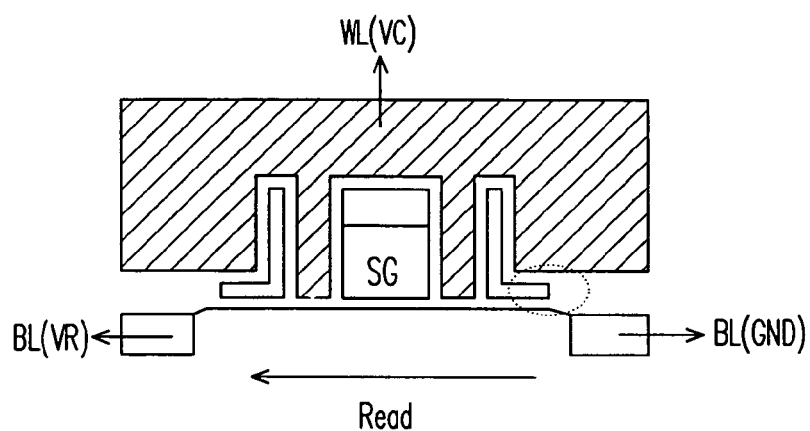
Figure 11C:
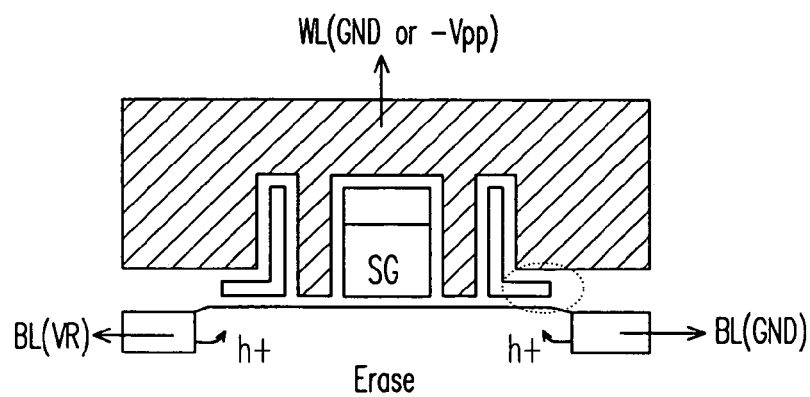

FIGS. 11A–11C are cross-sectional views, schematically illustrating the program, read, and erase operations for the structure in FIG. 10A. In FIG. 11A, the write operation is shown with the applied voltages. Hot electrons are injected into the region 2000 with rather local distribution. In FIG. 11B, the read operation is shown to read the information at the same bit. The storage charge would change the threshold value to indicate the stored content. In FIG. 11C, when the band-to-band holes are injected to the charge storage layer, since the charge is in well localized, the neutralization is easy without causing, for example, residual charges.

Figure 12:
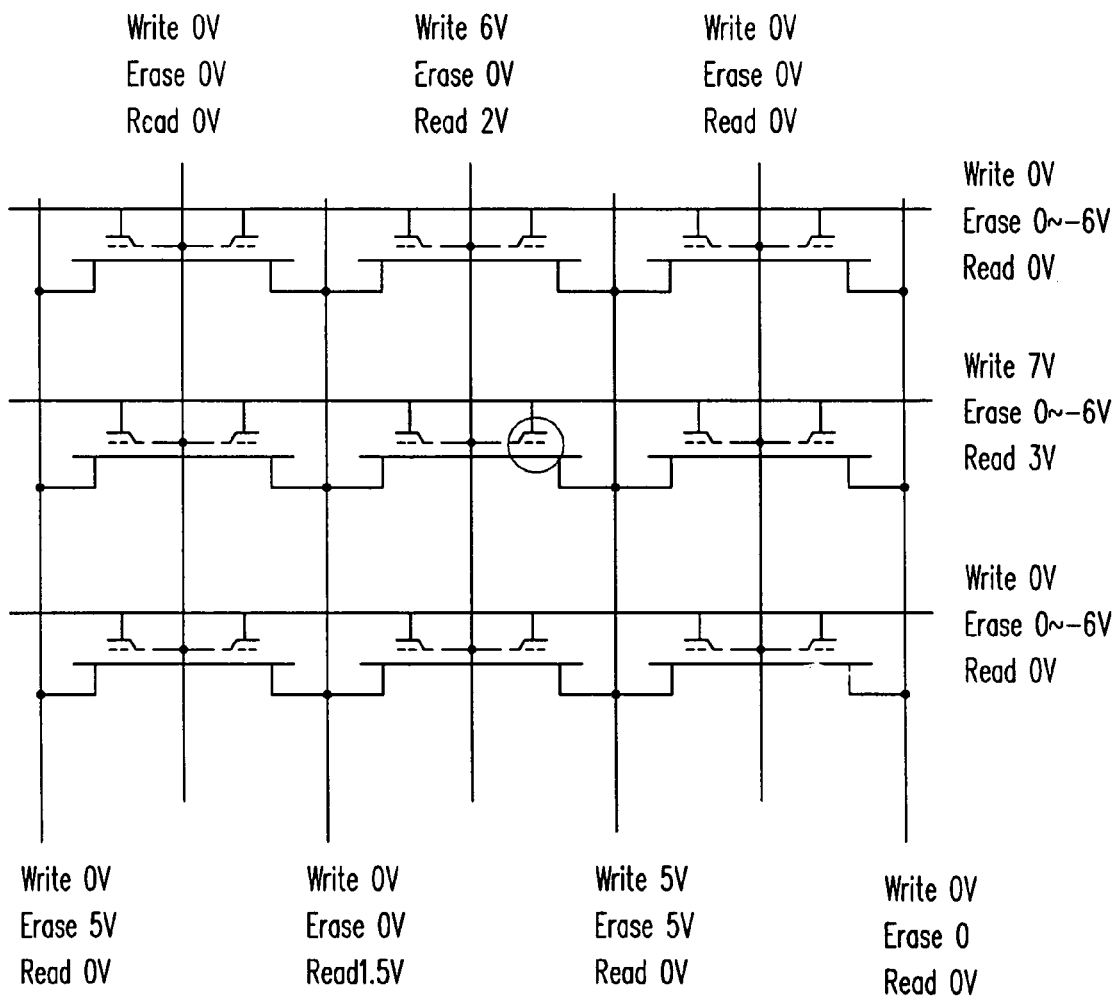
FIG. 12 is a circuit drawing, schematically illustrating the circuit structure of the memory device, according to the structure in FIG. 10A in the invention.

FIG. 12 is a circuit drawing, schematically illustrating the circuit structure of the memory device, according to the structure in FIG. 10A of the invention. In FIG. 12, the set of operation voltage as an example for write, read and erase are shown. The horizontal lines are word lines, coupled to the gate. The selection gate line is at the middle of the dual-bit memory cell. The bit line is coupled to the source/drain of the memory cell. For example, for the write (or program in other descriptions) operation, in order to drive the hot electrons into the horizon part of the L-shape nitride layer, the word line and bit line of the written cell are set in relative high positive voltages.

Figure 13A:
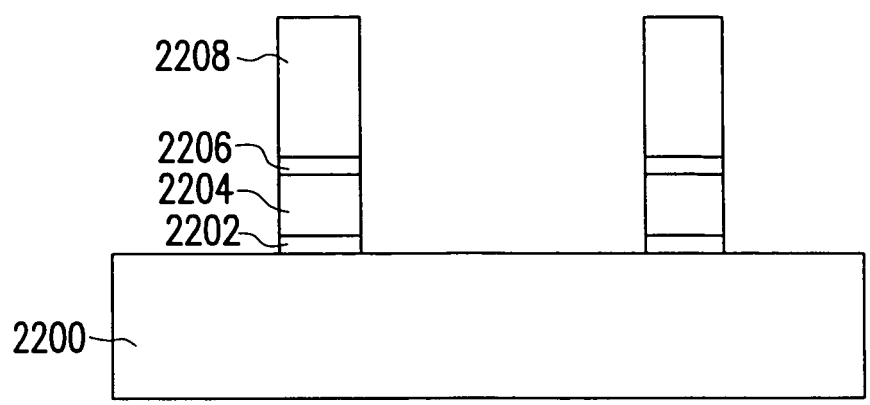
FIGS. 13A–13F are cross-sectional views, schematically illustrating a fabrication process for forming the structure in FIG. 10A of the invention.

FIGS. 13A–13F are cross-sectional views, schematically illustrating a fabrication process for forming the structure in FIG. 10A of the invention. In FIG. 13A, a gate structure including the gate insulating layer 2202, the selection gate layer 2204, a cap layer 2206 are sequentially formed on the substrate 2200. The selection gate layer can be, for example, the polysilicon layer. The gate insulating layer 2202 can be gate oxide layer, and the cap layer 2206 is the dielectric, such as silicon oxide or silicon nitride. Then, a patterned photoresist layer 2208 is formed on the cap layer 2206. An etching process is performed to expose the substrate 2200.

Figure 13B:
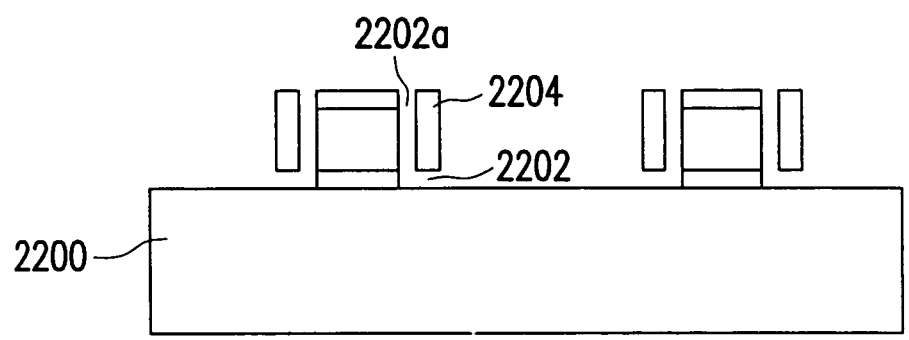
Figure 13C:
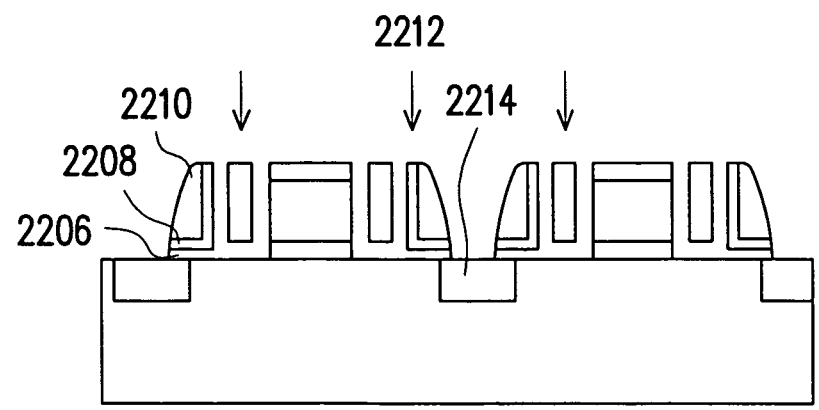

In FIG. 13B, after removing the photoresist layer 2208, another gate oxide layer 2202 and a control gate 2204 are formed at sidewall of the selection gate structure. In FIG. 13C, the tunneling oxide layer 2206, the silicon nitride layer 2208 and the spacer 2210 are over the control gate 2204. As a result, a portion of the substrate between the spacers 2210 is exposed. An implantation process 2212 is performed to dope the exposed portion of the substrate to form the doped region, serving as the bit line 2214.

Figure 13D:
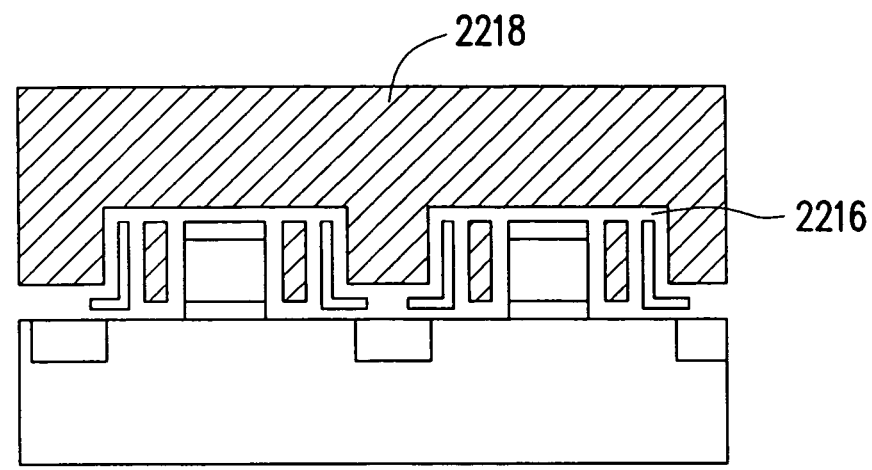
Figure 13E:
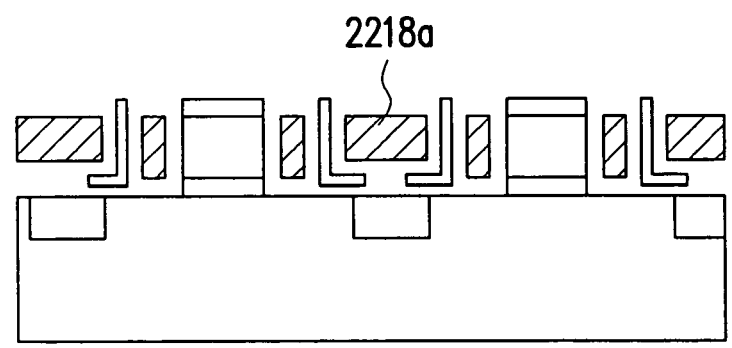

In FIG. 13D, the spacer 2210 is removed. Another oxide layer 2216, serving as a top oxide layer, is formed over the substrate 2200, and a polysilicon layer 2218 is deposited on the oxide layer 2216. In FIG. 13E, an etching back process is performed to remove a top portion of the polysilicon layer 2218, which becomes the polysilicon layer 2218a, also serving as another gate over the L-shape charge storage layer. Here, the polysilicon etching back process also exposes the control gate 2204 (see FIG. 13B). Here, the oxide layer is just schematically shown.

Figure 13F:
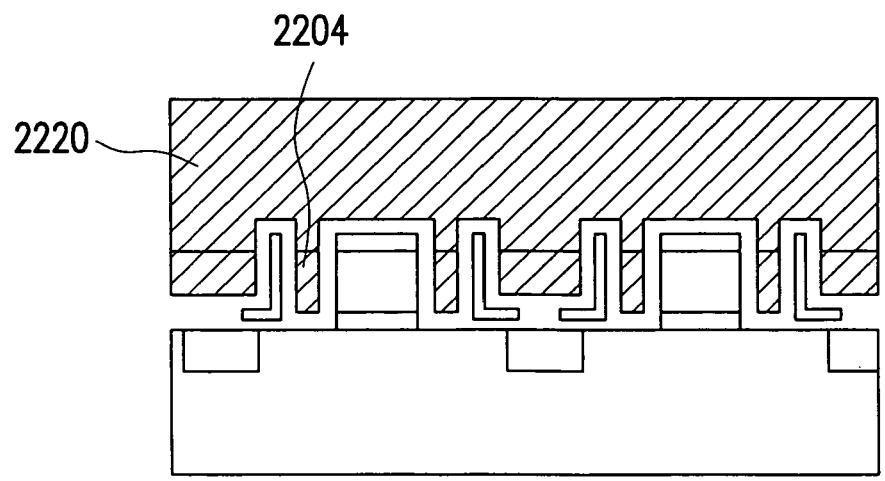

In FIG. 13F, another polysilicon layer 2220, serving as the word line is formed over the substrate, extending along a direction crossing over the bit line 2214. Here, the polysilicon layer 2220 is connected with the remaining gate 2204 and gate 2218a to form a complete word line. In other words, the word line also provides the needed gate portion. The operation voltages can be applied to the word line to operate the memory cells.

Embodiment 2

In the invention, further a novel structure of non-volatile memory is proposed. In the invention, selection gate (SG) lines are for example in the middle of a memory cell with separated two charge storage films over the substrate between the bit line and SG line, and preferably also on the sidewall of the SG line. A pocket doped region is formed in the substrate about under the sidewall of the selection gate. In operation, when the selection gate lines are applied a voltage, the substrate at the corresponding region becomes an inversion region, which can serve as a S/D region. In this design, the storage charges can be well localized to the desired region in the charge storage layer, such as the nitride layer. Embodiments with drawings are used as the example for descriptions.

Figure 14A:
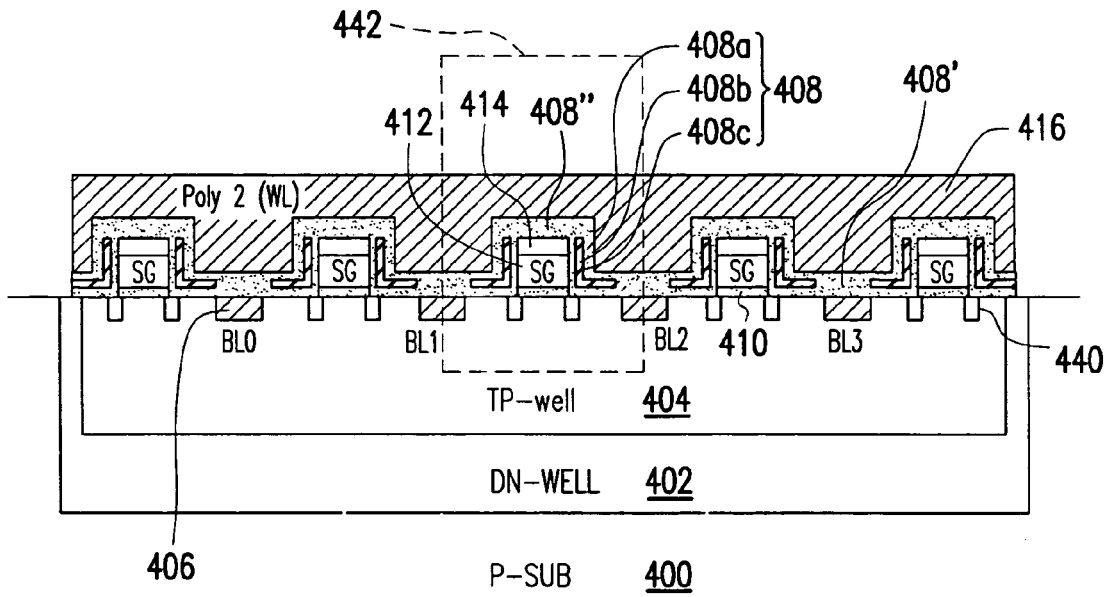
FIG. 14A is one cross-sectional along the word line, schematically illustrating a novel non-volatile memory, such as flash memory, according to an embodiment of the invention.

FIG. 14A is one cross-sectional along the word line, schematically illustrating a novel non-volatile memory, such as flash memory, according to an embodiment of the invention. Basically, the memory device includes the peripheral circuit region and the memory region. There are many device elements formed in these regions at various doped wells. This aspect should be known by the ordinary skilled artisans without further descriptions. In FIG. 14A, the memory device of the invention is formed on a substrate 400 at the well 404 is taken as the example for descriptions. The P-type well 404 may also be formed within an N-type well 402. The memory cells are formed on the well 404.

In FIG. 14A, several buried bit lines 406 are formed in the substrate 400 by implanting the conductive dopant, such as the N-type dopants. Here, only four bit lines BL0–BL3 are shown as the example of a part of the actual memory device. The selection gates 412 are formed over the substrate 400 with the gate dielectric layer 410 in between. A cap layer 414 is formed on the selection gate 412 for improve the isolation from the word line 416 later formed. The gate dielectric layer 410, the selection gate 412 and the cap layer 414 can be considered as a selection gate structured layer. The L-shape charge storage structure layer 408 are formed on the sidewall of the selection gate structure layer and the substrate between the selection gate 412 and the buried bit line 406. The charge storage structure layer 408 can store the charges to serving the memory function. Usually, the charge storage structure layer 408 can be the oxide/Nitride/Oxide (O/N/O) structure, in which the nitride layer 408b, such as silicon nitride, is used to store the charges. The oxide layer 408c serves the tunneling effect, and the top oxide layer 408a serves the isolation function. However, the nitride layer can be replaced any material with similar function, such as Si rich SiN, tantalum oxide ($Ta_2O_5$), aluminum oxide ($Al_2O_3$) or nano-crystal silicon. The O/N/O structure of the invention is the L-shape, in which the horizontal portion are mainly used to store charges and the vertical portion is used to improve the separation of the two memory bits in the same cell. Due to the easy fabrication process, the nitride layer 408b above the selection gate 412 and the bit line 406 are naturally removed during fabrication process. However, it is not necessary to be restricted. The oxide layer 408a and 408c form together as the oxide layer 408' and the oxide layer 408" with the nitride layer. The word line 416 is formed over the memory cells and is isolated from the bit lines 406 and selection gates 412.

In the invention, an additional doped region 440, or called pocket doped region, is specifically formed in the substrate about under the bending corner of the L-shape charge structure layer 408. The pocket doped region 440 is doped with. P-type dopant in this example, and is different from the conductive type of the bit line 406. The at least advantages of this cell structure of the invention are no charge laterally diffusion effect from the bit line due to a stop by the pocket doped region 440. It can allow and offer lower programming current for page mode program operation. Select transistor and buried N+ bit line separate charge storage locations of two adjacent memory cells, and can prevent charge laterally diffuse to cause adjacent data missing.

Figure 14B:
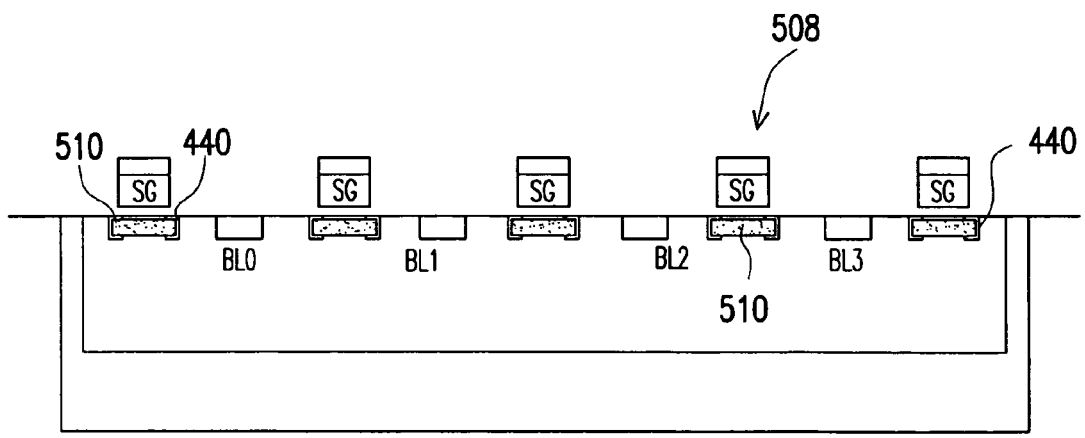
FIG. 14B is another cross-sectional view between word lines, schematically illustrating a novel non-volatile memory, according to an embodiment of the invention.

Also and, FIG. 14B is another cross-sectional view between word lines, schematically illustrating a novel non-volatile memory, according to an embodiment of the invention. Between adjacent two word lines 416 and between the select transistors of the word lines, the high threshold voltage (HVT) transistor 508 is inserted to turn off the current between bit line BL outside the WL area during program and read operation, especially when the cell size is greatly reduced by shrinking. The features of the HVT transistor are that the doped region 510 cause the high threshold voltage ($V_T$). The extra pocket implanted region 510 is to prevent the un-selected L-shape memory transistors from being turned on by the voltage applied on select gate and to reduce the effect of select gate voltage on selected L-shape memory transistors. This cell adopts source side hot electron injection that can perform extremely low program current and high program speed. The method to fabricated the structure in FIGS. 14A and 14B are to be described later in FIGS. 16A–16G or FIGS. 17A–17H.

Figure 15:
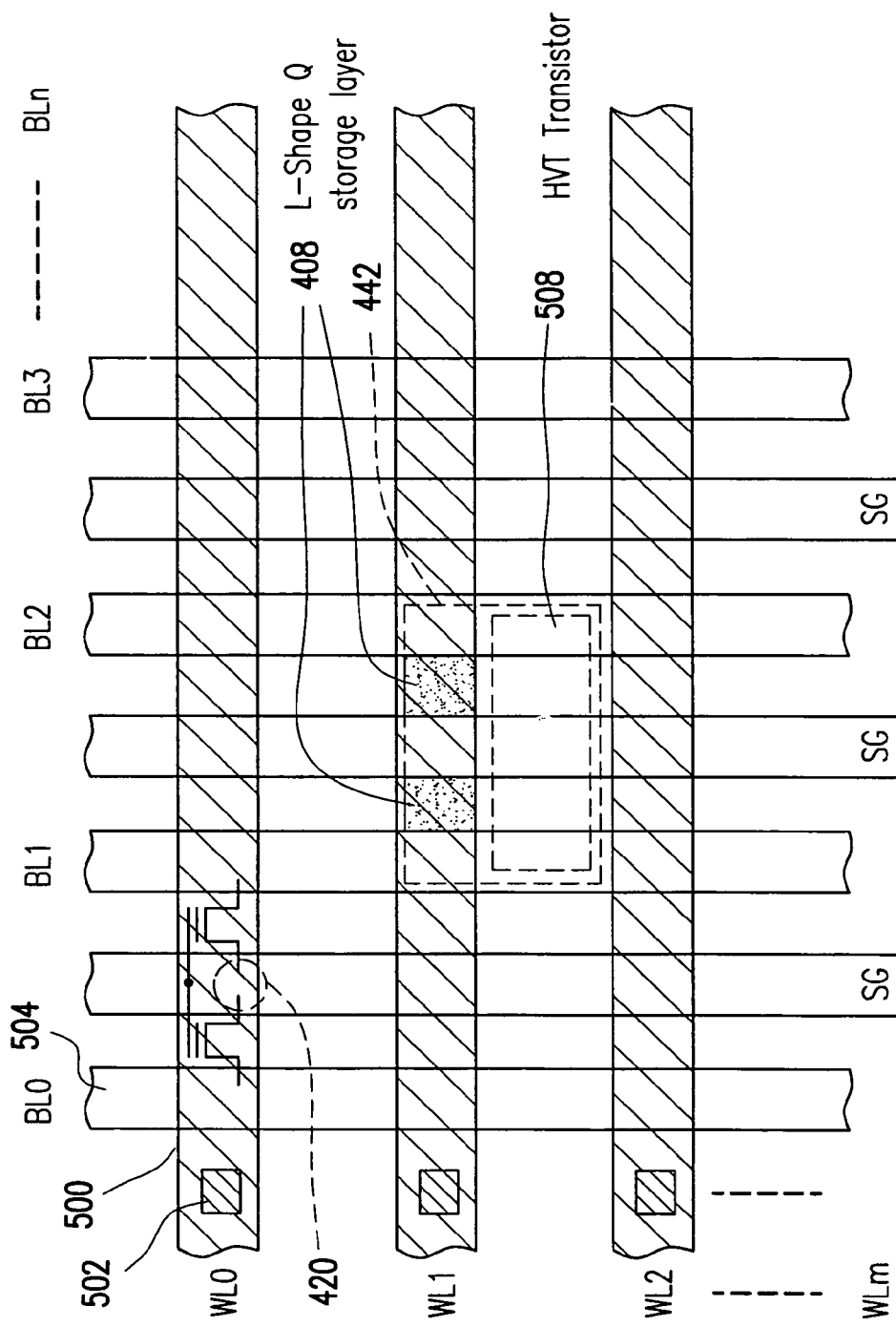
FIG. 15 is a top view, schematically illustrating a novel non-volatile memory, according to an embodiment of the invention.

FIG. 15 is a top view, schematically illustrating a novel non-volatile memory, according to an embodiment of the invention. In FIG. 15, the world line voltage is applied to the memory cell. Here, since the word line 416 also serves the gate in memory cell between two bit lines, one common gate with two bits is shown. The region 420 in the substrate is corresponding to SG line to be turned on/off. In other words, the region 420 is virtually existing in the substrate, and is to be created when a proper voltage is applied to create the inversion region in semiconductor properties.

In this design, when the SG line 412 is applied a voltage, an inversion region (not shown) is created in the substrate 400 under the SG line 412. This inversion region serves as another S/D region. In other words, the S/D region does not appear until the selected SG line is applied with the working voltage. Two charge storage regions, as two bits, are located at side regions of the SG line 412 with the same cell gate electrode between adjacent two bit lines 406 (contributed form the word line 416). The size of charge storage region is about 0.5 F, while the width of the SG line is about 1 F. Therefore, there two bit in one memory cell is formed between two adjacent bit lines, in which the SG line is commonly used by the two memory bits, as equivalently shown in FIG. 15.

Further the novel cell structure, the cell 442 is taken as the example for descriptions. In the top view of FIG. 15, the region 408 is the horizontal portion of the L-shape charge structure layer 408, and is schematically equivalent to FIG. 14A. The HVT transistor with respect to FIG. 14B is located between word lines and the memory transistors. Here, the term of "high" in HVT means the threshold voltage is higher than the threshold voltage of the memory cell by a quantity for on/off operation. Since the HVT transistor 508 has the higher threshold voltage, when selection gate is applied a proper voltage, the HVT is off. As a result, the leakage current can be reduced, as to be discussed in FIGS. 20A and 20B.

In the following descriptions, the fabrication processes are illustrated. FIGS. 16A–16G are cross-sectional views, schematically illustrating the fabrication process of the nonvolatile memory device, according to an embodiment of the invention. Only a related portion of the substrate is shown as the example for descriptions.

In FIG. 16A, a gate dielectric layer 410, a conductive layer 412, and a cap dielectric layer 414 are sequentially formed over the substrate by for example chemical vapor deposition (CVD) with the desired raw material. For example, the gate dielectric layer is oxide, the conductive layer 412 is polysilicon, and the cap layer is oxide or nitride dielectric layer. Optionally, the cap layer 414 is for better isolation from word lines later. However, the cap layer is preferred but is not strictly necessary. Then, the layers are patterned to form the conductive line structure, serving as i.e. the selection gate structure line. The patterning process includes the photolithographic process to form the photoresist layer 600 with a desired pattern. Then, the photoresist layer 600 is used as mask for the etching process. Before or after striping the photoresist layer 600, a tilt implantation process 602 is performed to form the pocket doped region 440 in the substrate about under sidewalls of the selection gate structure line (410+412+414).

In FIG. 16B, a tunneling dielectric layer 604 and a charge storage layer 606 are sequentially formed over the substrate, including covering the sidewalls of the selection gate structure line and the exposed portion of the substrate. The tunneling dielectric layer 604 usually is the tunneling oxide layer, and the charge storage layer 606 usually is the silicon nitride layer for storing charges to perform the memory function.

In FIG. 16C, dielectric spacers 608 are formed over the sidewall of the selection gate (SG) structure line. The spacers can be formed by depositing a dielectric layer and performing etching back so as to expose the cap layer 414 of the SG structure line and the substrate. During the etching back process, the charge storage layer 604 over the SG structure line is preferably removed to have better separation between two memory bits, but is not the necessary limitation. An implantation process is performed to form the buried bit lines 406 in the substrate under the exposed portion of the substrate. Since material of the spacers 608 is different from the charge storage layer 604 to have a better etching selectivity, the spacers 608 usually is oxide, which is similar to the tunneling dielectric layer 604. If the spacer 608 is removed, the exposed side of the tunneling dielectric layer 604 is removed also. In order to avoid these issues, an etching mask layer 610 is further formed to partially fill the gap between the spacers 608. However, the spacers 606 remain being exposed. The etching mask layer 610 can, for example, be a photoresist layer, which is etched backed.

In FIG. 16D, an etching process, such as wet etching, is performed to remove the spacers 608 based on etching selectivity, for example, between oxide and nitride. As a result, a portion of the tunneling dielectric layer 604 and the charge storage layer 606 still remain on the sidewall of the SG structure line.

Figure 16E:
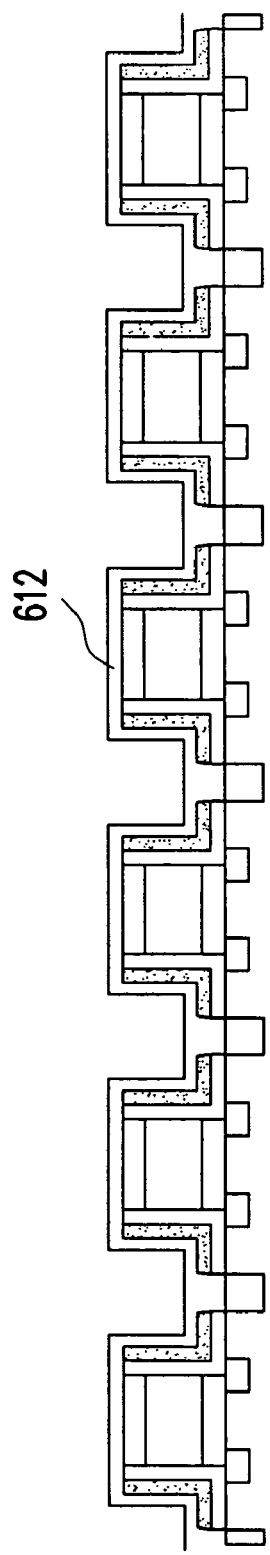

In FIG. 16E, the etching mask layer 610 is removed. A top dielectric layer 612 is formed over the substrate. The top dielectric layer 612 can be oxide layer, so that the top dielectric layer 612 with the charge storage layer 606 and the tunneling dielectric layer 604 form the O/N/O structure as previously described. The top dielectric layer 612 also covers the SG structure lines and the buried bit lines 606.

Figure 16F:
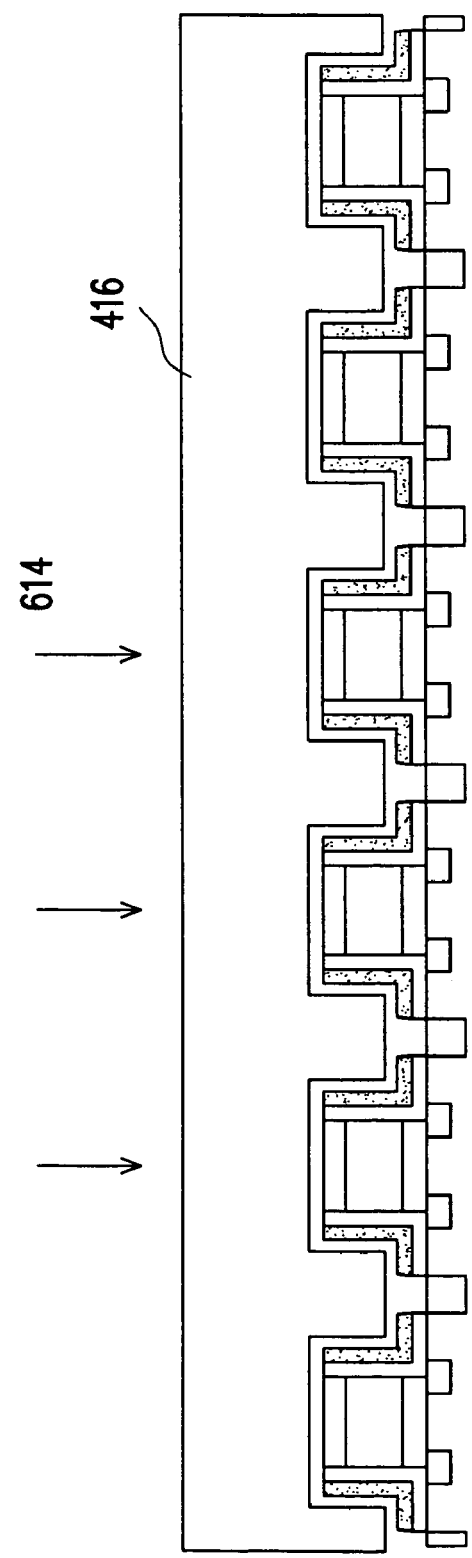

In FIG. 16F, word lines 416 are formed over the substrate in a direction crossing the bit lines. The word lines can be formed by depositing a conductive layer, such as polysilicon layer, over the substrate, and patterning the polysilicon layer. As also shown in FIG. 15, the word lines 416 only cover a portion of the substrate. The word lines 614 has the additional thickness. In this situation, another threshold-adjusting implantation process 614 is performed using the word line as the mask. Since the thickness of the word lines, the dopants do not enter the substrate.

Figure 16G:
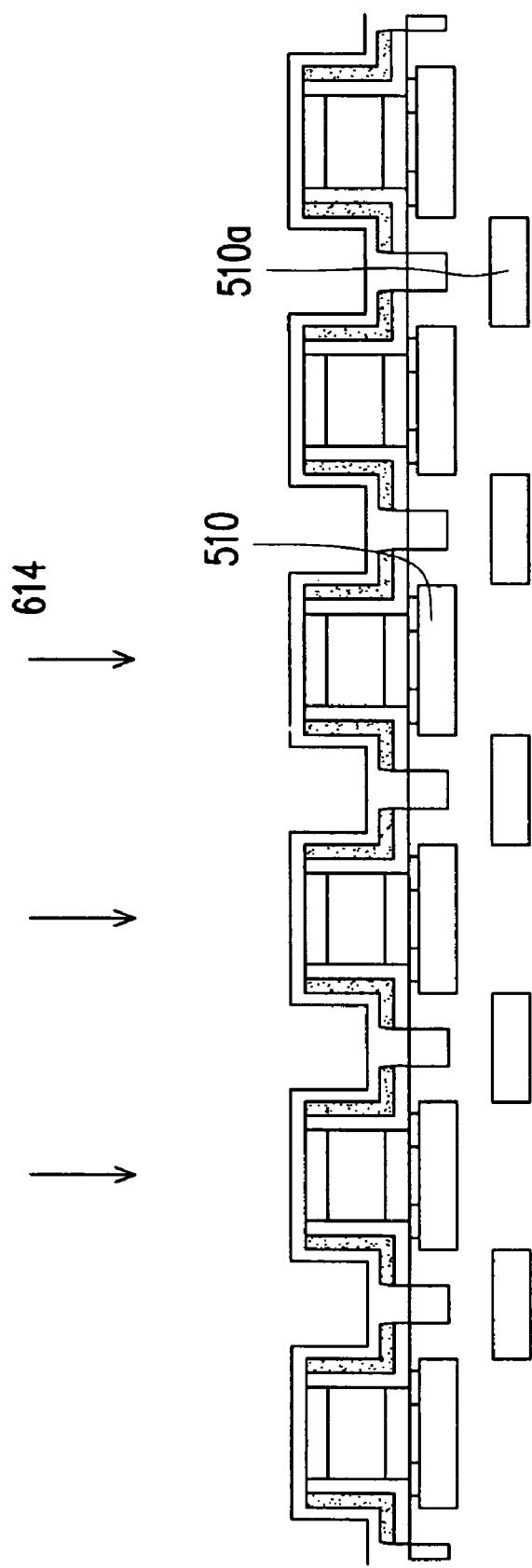

In FIG. 16G, however, the dopants enter the substrate to form the doped region 510. The doped region 510 causes the increase of the threshold voltage to form the HVT transistor. The doped region 510 has, for example, the different conductive type from the bit lines, and can merge with the pocket doped regions. Due to no masking material above the bit line regions, the doped region 510a is also formed. However, doped region 510a does not significantly reduce the performance. The HVT transistor uses the two buried bit lines as the S/D regions and uses the SG structure line as the gate electrode. The HVT transistor 508 (see FIG. 15) can reduce the current leak in operation. The mechanism is to be described later.

Figure 17A:
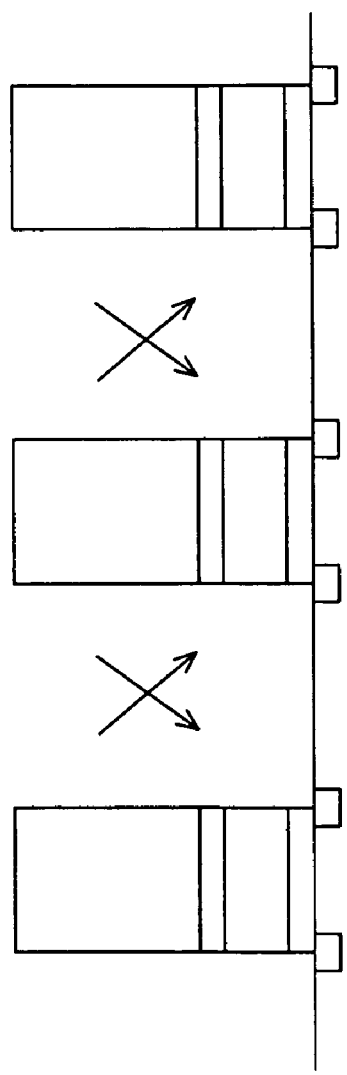
Figure 17B:
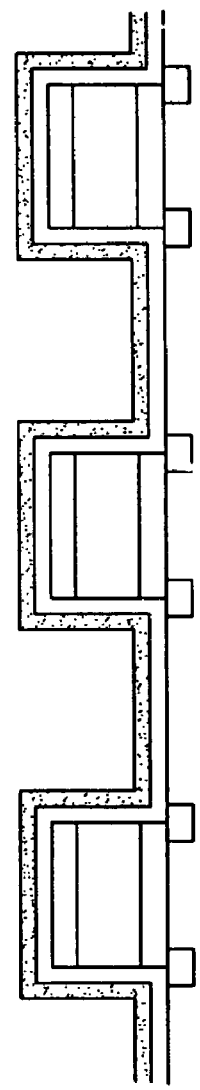
Figure 17C:
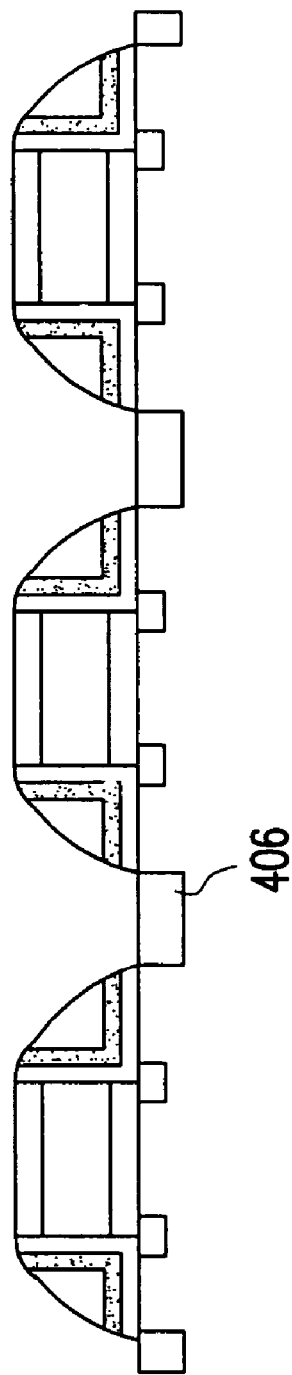
Figure 17D:
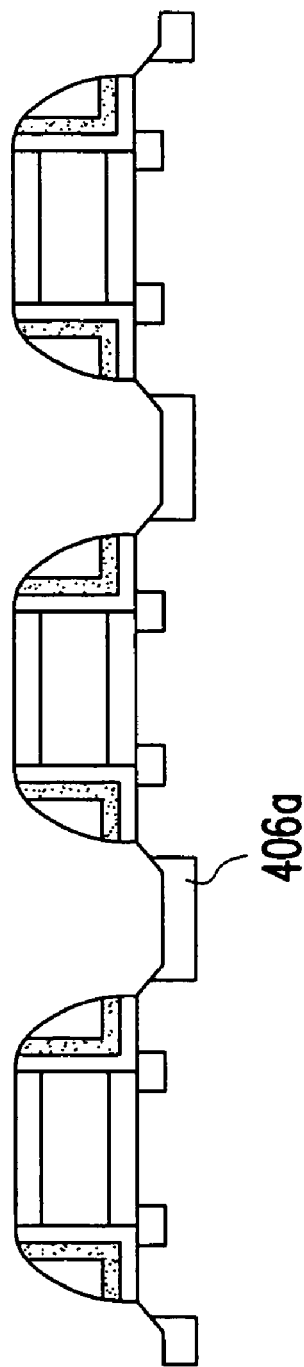

Alternatively, under the same design principle, FIGS. 17A–17H show another example in fabrication. FIGS. 17A–17C are similar to FIGS. 16A–16C and are not described here. In FIG. 17D, another substrate etching back process is performed to remove a portion of the substrate to have a shallow trench. Here, preferably, by adjusting the etchants, the oxide spacers can be also etched. As a result, the buried bit line 406 becomes the buried bit line 406a with indent portion. The level is lower than a base surface level of the substrate.

Figure 17G:
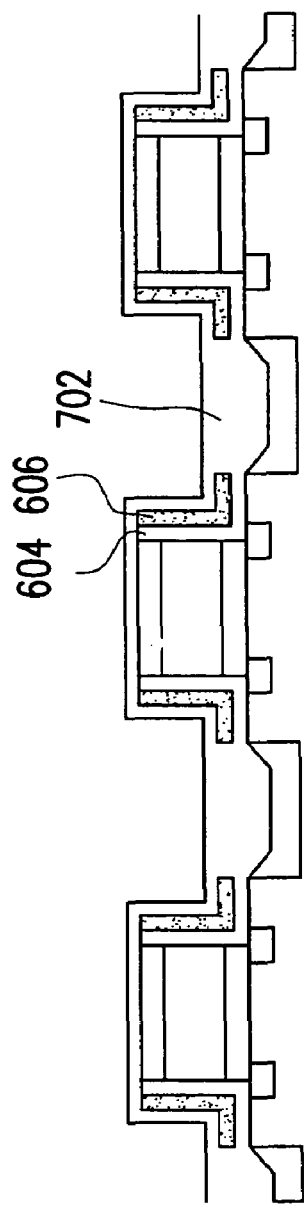
Figure 17H:
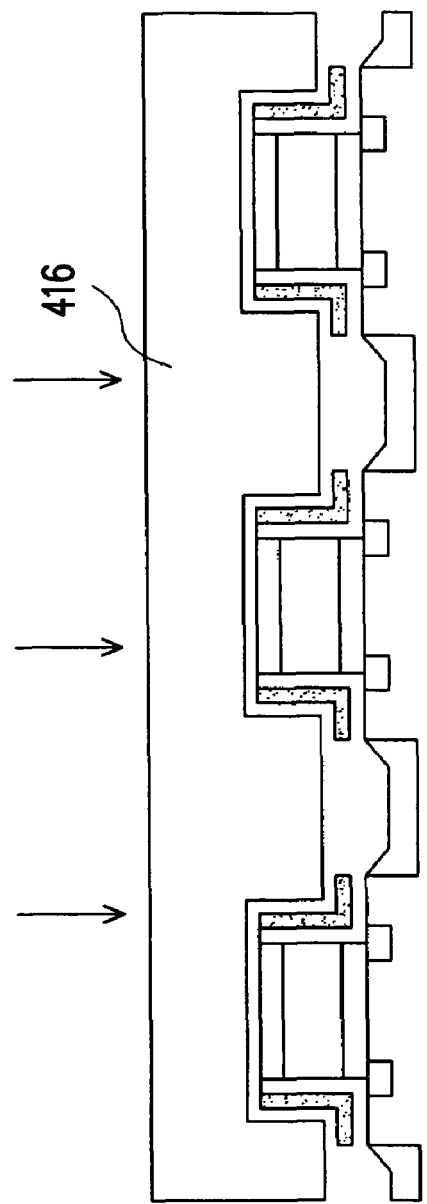

In FIGS. 17E–17F, the processes are similar to FIGS. 16C–16D. In FIG. 17G, the dopants implanted in the bit lines are usually diffused by an annealing process. As a result, the width of the bit line 406a (see FIG. 17D) increases. In FIG. 17H, the word line 416 is formed, and the threshold-adjusting implantation process is also performed to form the HVT transistor. The process is similar to FIG. 16F and 16G.

Figure 18:
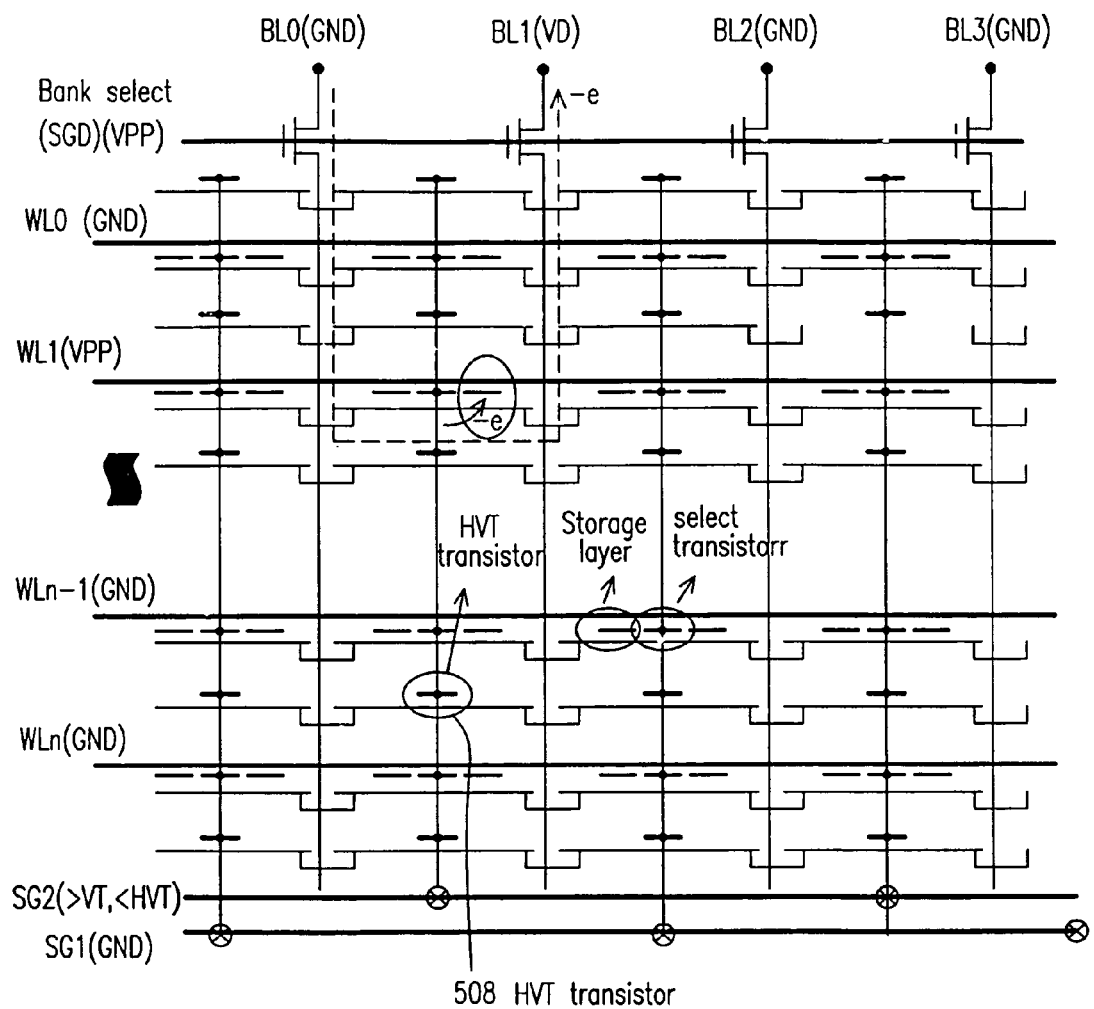
FIG. 18 is a circuit structure, schematically illustrating the programming operation of the nonvolatile memory device, according to another embodiment of the invention.

In the following, the operating mechanism for the memory is described. FIG. 18 is a circuit structure, schematically illustrating the programming operation of the nonvolatile memory device, according to another embodiment of the invention. In FIG. 18, to program the memory cell, the word line of selected cell, indicated by circle as the example, is pulled high to a voltage VPP, and the other word lines are biased to a ground voltage GND. The corresponding BL of program cell is biased to VD, Bank select gate SGD is applied a turn-on voltage, such as VPP, to pass BL voltage. The corresponding select transistor is turned on by applying select gate (SG2) voltage between threshold voltage of select transistor and the threshold voltage of HVT transistor to constraint programming current and reduce leakage current. Adjacent cell program disturb could be prevented by turning off another select gate transistor. The other unselected cells are off by setting the selection gate voltage (SG1) to the ground voltage. The HVT transistors 508 are between the word lines and between the corresponding memory cells. The HVT transistors 508 can reduce the current leakage.

Figure 20A:
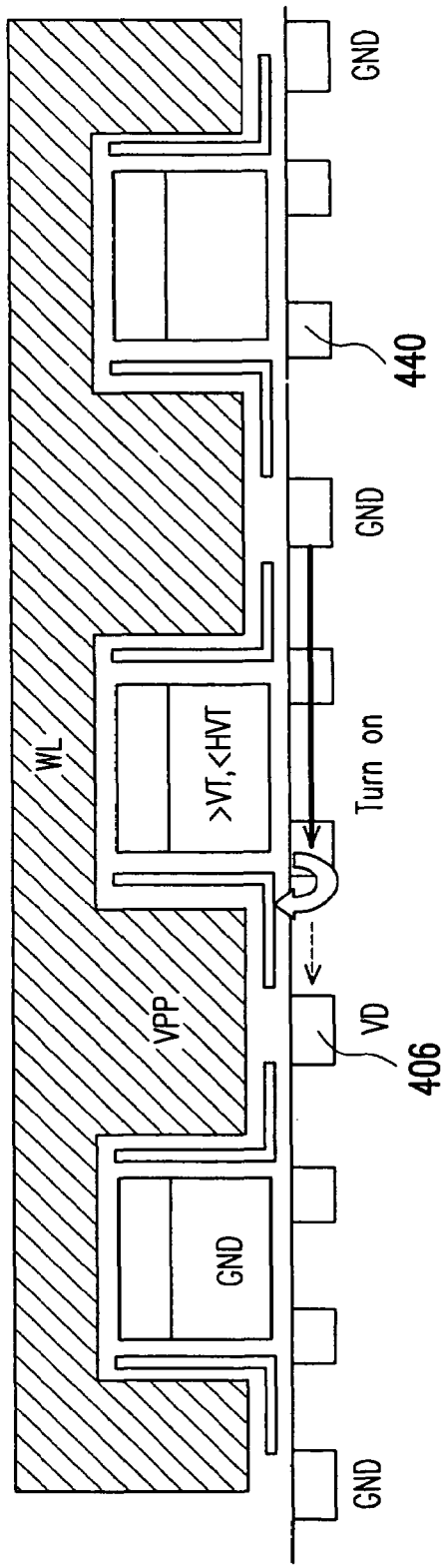
FIGS. 20A–20B are cross-sectional views, schematically illustrating the programming mechanism of the nonvolatile memory device, according to another embodiment of the invention.
Figure 20B:
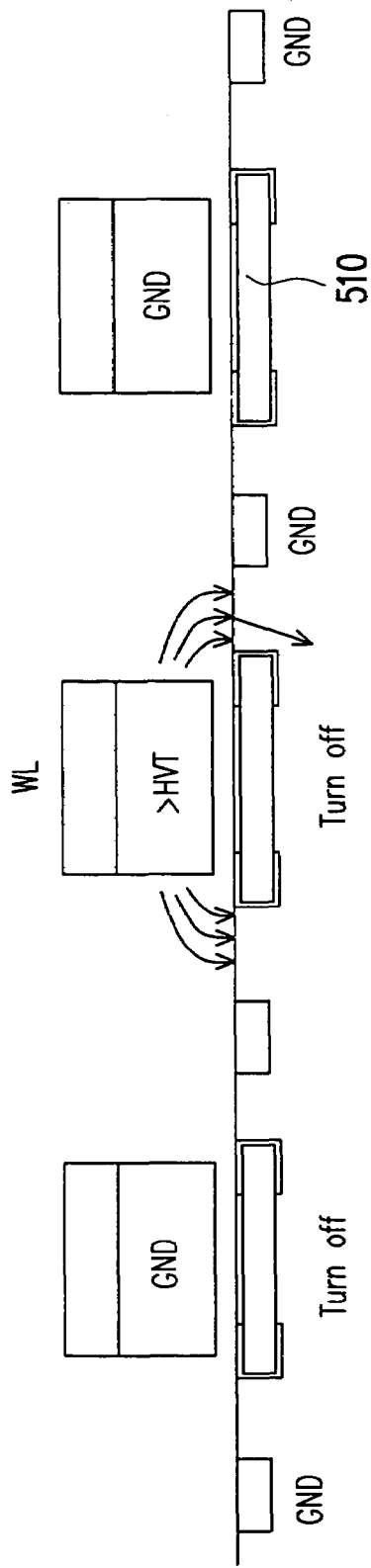

Here in programming operation, also referring the FIGS. 20A–20B, FIGS. 20A–20B are cross-sectional views, schematically illustrating the programming mechanism of the nonvolatile memory device, according to another embodiment of the invention. In FIG. 20A, the selection gate voltage SG2 is set to the voltage level between the threshold voltage of select transistor and the threshold voltage of HVT transistor. In this situation the adjacent HVT transistor is clearly at off-state, so that the current is constrained. However, if the selection gate voltage is over then the threshold voltage of the HVT transistor, as shown in FIG. 20B, a current leakage may occur. Therefore, the HVT transistor can reduce the current leakage when the voltage level is properly set.

Figure 19:
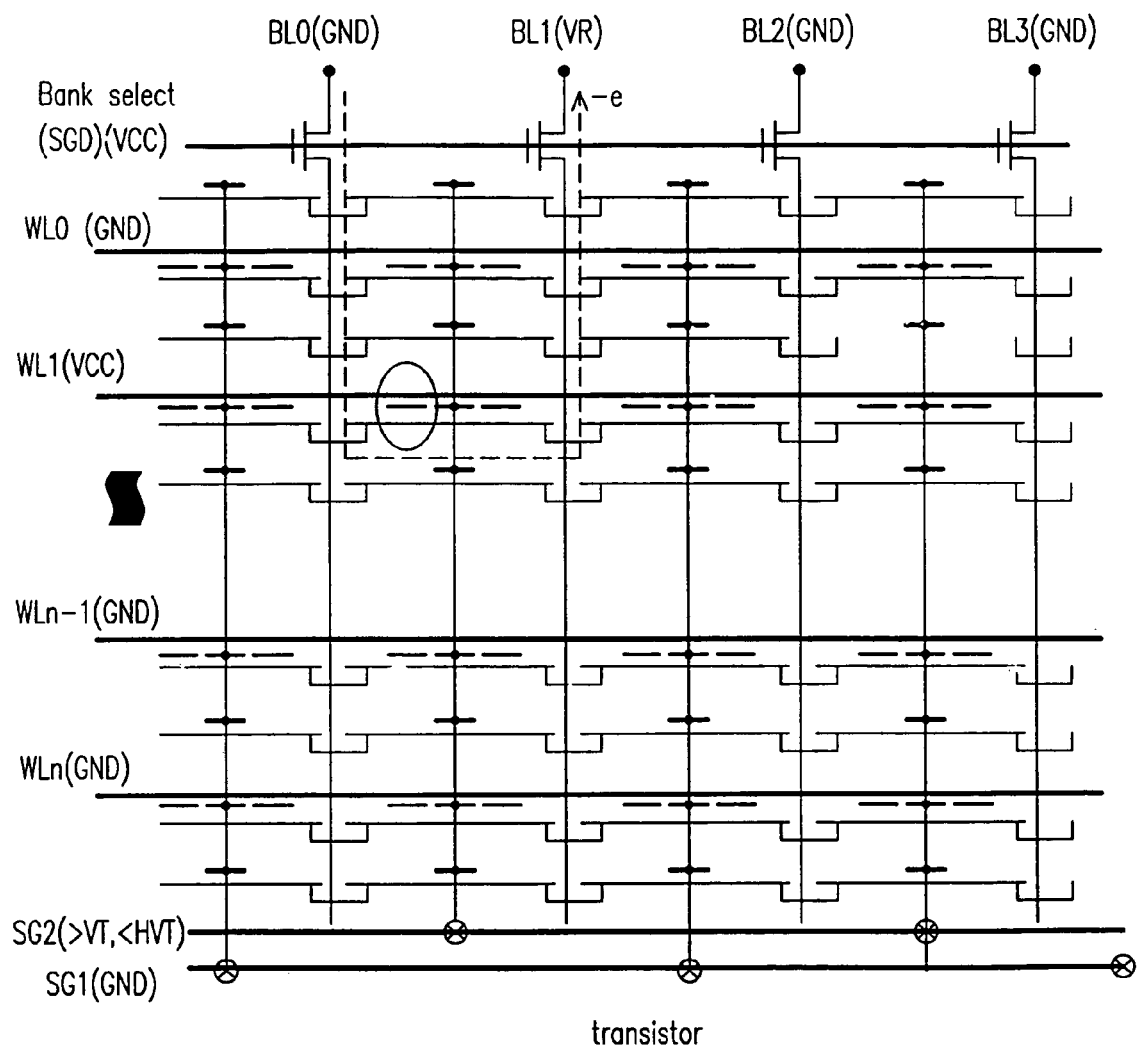
FIG. 19 is a circuit structure, schematically illustrating the reading operation of the nonvolatile memory device, according to another embodiment of the invention.

FIG. 19 is a circuit structure, schematically illustrating the reading operation of the nonvolatile memory device, according to another embodiment of the invention. In FIG. 19, the set of read operation voltage is applied. To read selected cell, first the corresponding word line and the corresponding bank select transistor of selected cells are applied to a voltage level VCC, and the other word lines are biased to a ground voltage GND, and the corresponding BL of read cell is biased to a voltage VR and the others BL are set to the ground voltage GND. The corresponding select transistor is turned on by applying select gate (SG) voltage between the Vt of the select transistor and the Vt of the HVT transistor (around 0.8~2V; larger than Vt of select transistor, and smaller than HVT). The other SG lines are set to the ground voltage GND. In case of hole storage in memory, there will have current flow from selected BL. On the other hand, there will not have current flow for electron storage. The mechanism is described in FIGS. 21A–21B.

Figure 21A:
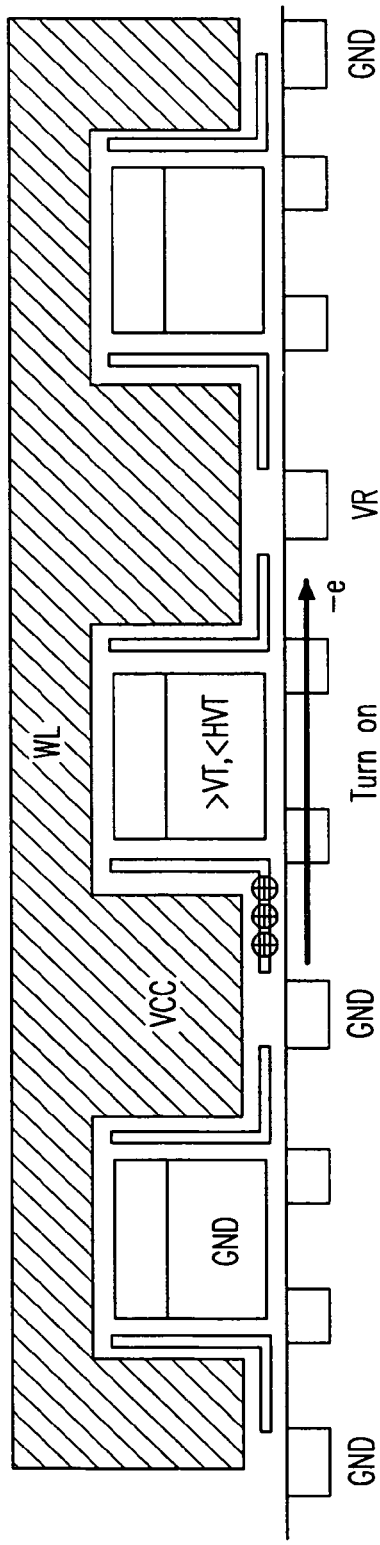
FIGS. 21A–21B are cross-sectional views, schematically illustrating the reading mechanism of the nonvolatile memory device, according to another embodiment of the invention.
Figure 21B:
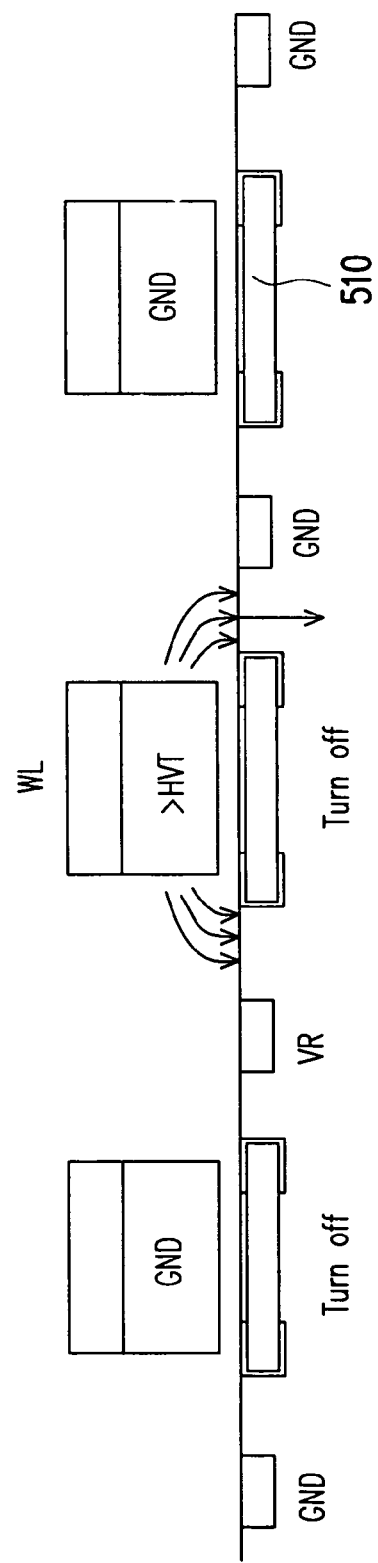

FIGS. 21A–21B are cross-sectional views, schematically illustrating the reading mechanism of the nonvolatile memory device, according to another embodiment of the invention. In FIG. 21A, in read operation, since the selection gate voltage is set between the Vt of the select transistor and the Vt of the HVT transistor. The adjacent HVT transistor is still off. The HVT transistor assures that there is no current leakage. In FIG. 21B, if the selection gate voltage is over then the threshold voltage of the HVT transistor, then a leakage would occurs. Therefore, the HVT transistor can avoid the current leakage.

Figure 22A:
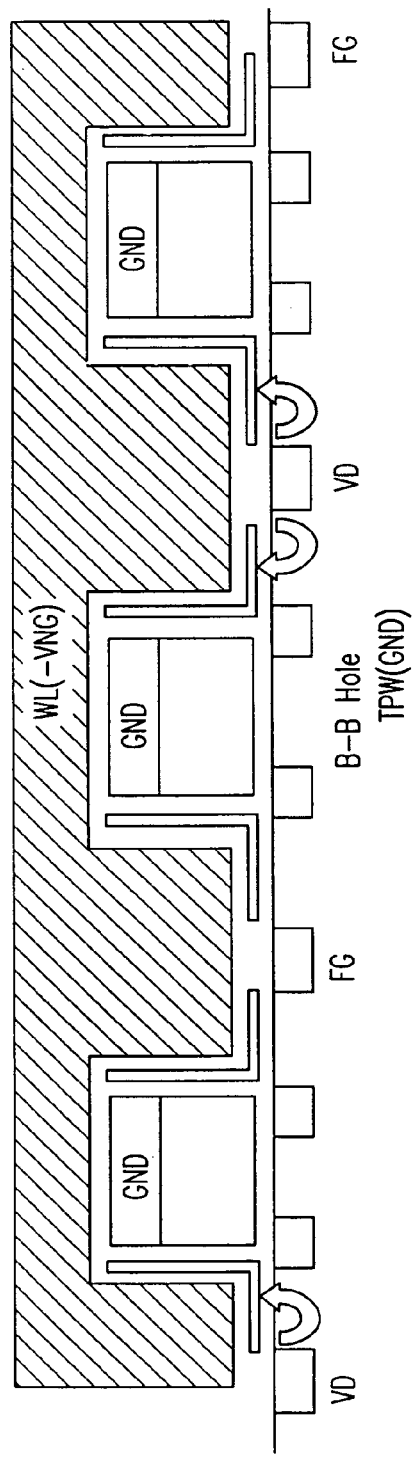
FIGS. 22A–22B are cross-sectional views, schematically illustrating the erasing mechanism of the nonvolatile memory device, according to another embodiment of the invention.
Figure 22B:
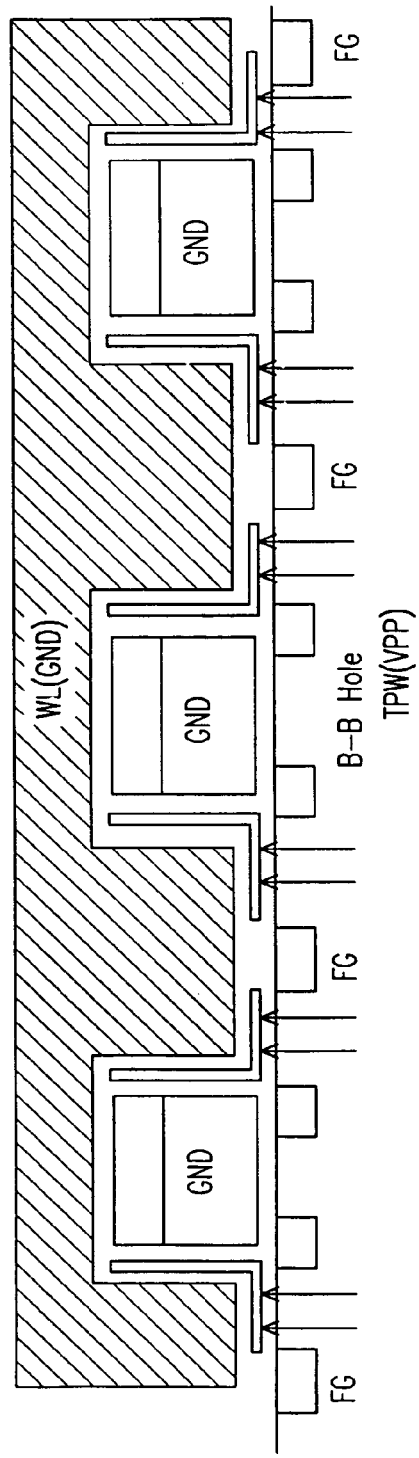

For the ease operation, it means the charges stored in the charge storage layer are to be neutralized away. Therefore, the erase operation is shown in FIGS. 22A–22B, which are cross-sectional views, schematically illustrating the erasing mechanism of the nonvolatile memory device, according to another embodiment of the invention. In FIG. 22A, one way is to drive the band-to-band (B-B) holes to the charge storage layer to neutralize the trapped electrons. In FIG. 22B, alternatively, the erase operation can use the channel F-N mechanism. The holes are directly tunneling into the charge storage layer.

Table 1 shown the sets of corresponding operation voltages for program, read and erase as the example for the cell 1.

TABLE 1

|  | Erase-1 | Erase-2 | Program | Read |
|---|---|---|---|---|
| BL0 | VD | FG | GND | GND |
| BL1 | GND | FG | VD | VR |
| BL2 | VD | FG | GND | GND |
| BL3 | GND | FG | VD | VR |
| SGD (Bank select) | VPP1 | FG | VPP1 | VCC |
| WL1 | VNG | GND | VPP1 | VCC |
| SG1 | FG/GND | FG | >VT, <HVT | VT < VSG < HVT |
| SG2 | FG/GND | FG | GND | GND |
| Unselected SGD | GND | FG | GND | GND |
| Un-selected WL | GND | GND | GND | GND |
| TP-WELL | GND | VPP | GND | GND |

Note:
VPP value is from 8 to 20 V.
VD value is from 3 V to 7 V
VNG is from 0 V to −10 V.
VPP1 is from 4 V to 12 V.
VR is from 0.6 v to 2 v.
VT is the threshold voltage of select transistor;
HVT is the threshold voltage of HVT transistor.
VSG is from 0.8~2 V.

The present invention includes the features of the selection gates formed between the two buried bit lines, wherein a pocket doped region and the HVT transistor are also introduced, so as to further reduce the possibility of current leakage in operation. The selection gates are properly controlled to apply the operation voltage, so as to create an inversion region. The inversion region can also serve as the additional S/D region in operation of MOS transistor. Also and the SG structure with the sidewall charge storage film can further improve the charge localization. The storage charges can be well localized at the expected region without causing charge-drifting error to the adjacent bit.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A structure of non-volatile memory unit with two-bit memory capacity, comprising:
    a substrate;
    two doped lines, located in the substrate;
    a selection gate structure line, disposed on the substrate between the two doped lines;
    a charged storage structure layer, located each side of the selection gate structure line between the doped lines and the selection gate line;
    a plurality of pocket doped regions, formed in the substrate about under sidewalls of the selection gate structure line;
    a first dielectric layer, disposed over the selection gate structure line;
    a second dielectric layer, disposed over the doped lines; and
    a gate electrode layer, disposed crossing over the doped lines and the selection gate structure line.

2. The structure of claim 1, further comprising a high threshold voltage (HVT) transistor adjacent to the gate electrode layer, using the selection gate structure line as a gate electrode and the two doped lines as two source/drain regions of the HVT transistor.

3. The structure of claim 1, wherein a doped region is formed in the substrate under the gate electrode of the HVT transistor to raise a threshold voltage.

4. The structure of claim 1, wherein each of the doped lines is just below a surface base level of the substrate.

5. The structure of claim 1, wherein a portion of the substrate with respect to the doped lines is removed to have a shallow trench, and each of the doped lines formed in the substrate under the shallow trench.

6. The structure of claim 1, wherein the charged storage structure layer comprises a dielectric/charge-storage/dielectric structure layer or a floating gate structure layer.

7. The structure of claim 6, wherein the charged storage structure layer comprises an oxide/nitride/oxide structure layer.

* * * * *